United States Patent [19]

Ishizaka et al.

[11] Patent Number: 5,764,668
[45] Date of Patent: Jun. 9, 1998

[54] SEMICONDUCTOR LASER DEVICE

[75] Inventors: Shoji Ishizaka, Ichihara; Kiyofumi Muro, Sodegaura; Tsuyoshi Fujimoto, Sodegaura; Yoshikazu Yamada, Sodegaura, all of Japan

[73] Assignee: Mitsui Petrochemical Industries, Ltd., Tokyo, Japan

[21] Appl. No.: 363,834

[22] Filed: Dec. 27, 1994

[30] Foreign Application Priority Data

Dec. 24, 1993 [JP] Japan .................. 5-328140
Feb. 25, 1994 [JP] Japan .................. 6-028102

[51] Int. Cl.$^6$ ............................................ H01S 3/19
[52] U.S. Cl. ............................................ 372/45
[58] Field of Search .................... 372/45, 43; 431/129

[56] References Cited

U.S. PATENT DOCUMENTS

| | | | |
|---|---|---|---|
| 4,328,469 | 5/1982 | Scifres et al. | 372/45 |
| 5,003,548 | 3/1991 | Bour et al. | 372/45 |
| 5,260,959 | 11/1993 | Hayakawa | 372/45 |
| 5,263,040 | 11/1993 | Hayakawa | 372/45 |
| 5,289,484 | 2/1994 | Hayakawa | 372/45 |
| 5,319,660 | 6/1994 | Chen et al. | 372/45 |
| 5,445,993 | 8/1995 | Ahn et al. | 431/129 |
| 5,467,364 | 11/1995 | Muro et al. | 372/45 |

FOREIGN PATENT DOCUMENTS

| | | |
|---|---|---|
| 348941 | 1/1990 | European Pat. Off. . |
| 0578836 | 1/1994 | European Pat. Off. . |
| 56-164588 | 12/1981 | Japan . |
| 58-216489 | 12/1983 | Japan . |
| 60-164379 | 8/1985 | Japan . |
| 62-173788 | 7/1987 | Japan . |
| 03071679 | 3/1991 | Japan . |
| 03076288 | 4/1991 | Japan . |
| 03290984 | 12/1991 | Japan . |
| 9316513 | 8/1993 | WIPO . |

OTHER PUBLICATIONS

Iga, K. Applied Optics, vol. 19, No. 17, Sep. 1980, New York, pp. 2940–2941.

Heterostructure Lasers, Part A Fundamental Principles, H.C. Casey, Jr. and M. B. Panish, Academic Press, New York 1978, pp. 31–57 (No month available).

Tsang, A New–Current Injection Heterostructure Laser:The Double Barrier. . . Applied Physics Letter 38(11), 1 Jun. 1981.

Yamada, Optimum Structure of a Potential Controlled Low Threshold Laser, transactions of the IEICE, vol. E, 71, No. 6, Jun. 1988.

Primary Examiner—Rodney B. Bovernick
Assistant Examiner—Yisun Song
Attorney, Agent, or Firm—Sherman AND Shalloway

[57] ABSTRACT

To overcome the dilemma on device design in control of waveguide mode experienced in the conventional weak wave-guide-laser and SCH structure laser, realize higher output and lower dispersion of radiation beam, and improve the waveguide mode, on both sides of an active layer, carrier blocking layers for reducing the waveguide function of the active layer are provided, and waveguide layers are provided on both outer sides of the carrier blocking layers, and cladding layers are provided on both outer sides of the waveguide layers, the active layer is lamination of side barrier layers and a quantum well layer sandwiched therebetween, or side barrier layers, and a quantum well layer and a barrier layer sandwiched therebetween, the composition of the quantum well layer is $Ga_y In_{1-y} As$ ($0.6 < y < 1.0$), and the carrier blocking layers are made of a material having a wider band gap and a lower refractive index than the material of the waveguide layers.

15 Claims, 15 Drawing Sheets

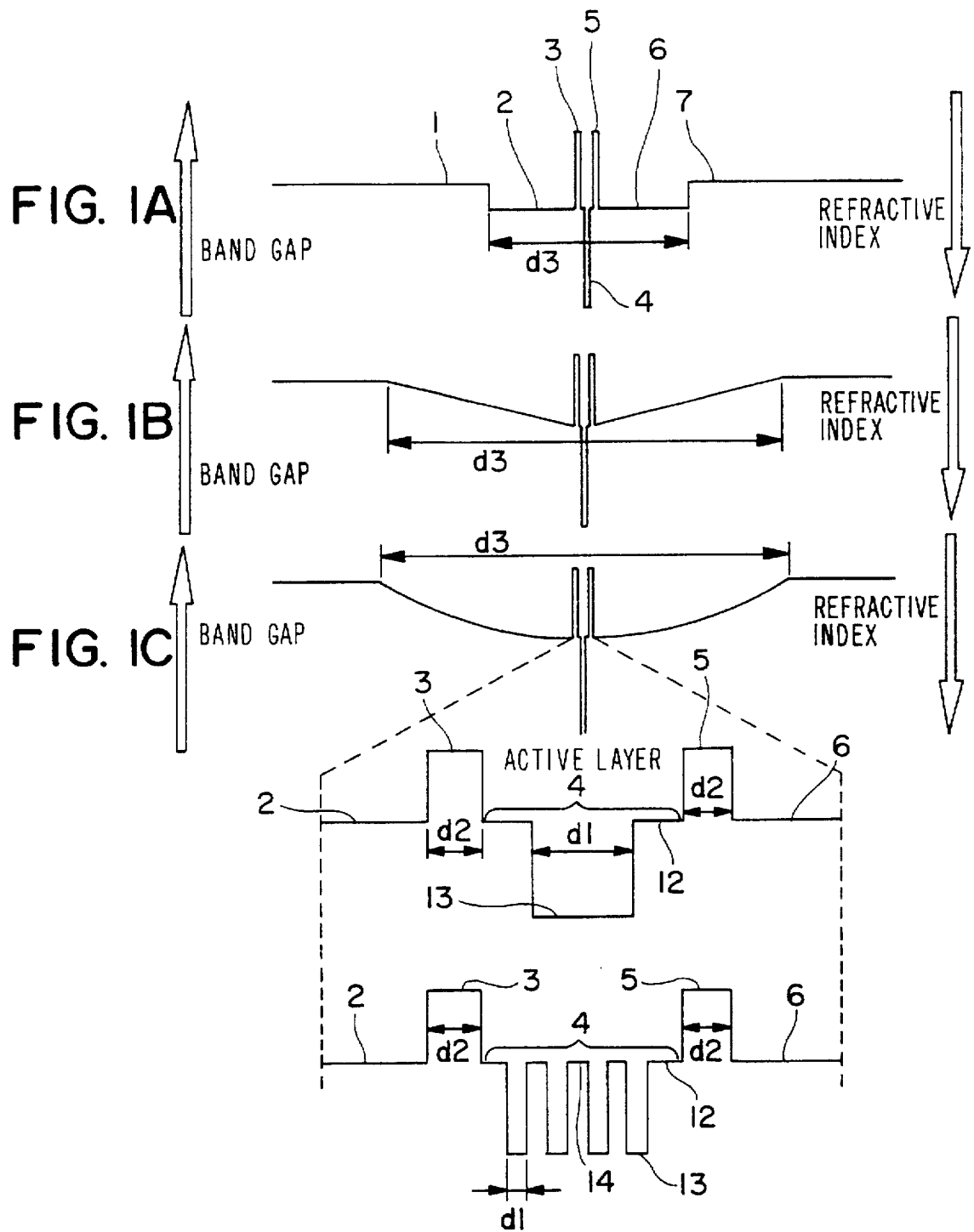

SEMICONDUCTOR LASER DEVICE

BACKGROUND OF THE INVENTION

1. Field of the Invention

The present invention relates to industrial fields employing high power semiconductor lasers, including, among others, communications, optical disks and other optical recording, laser printers, laser medical applications, and laser machining. More particularly, it relates to a high power semiconductor laser for exciting solid state laser or exciting a harmonic (generation device) that may require a laser beam with low radiation angle and high power.

2. Description of the Related Art

Higher outputs of semiconductor lasers have been demanded in various fields. One of the factors that impede higher output per single mode in a semiconductor laser is an end face (facet) melting by laser beam, called catastrophic optical damage (COD). To avoid the COD, with a main purpose of reducing the power density of laser by expanding the waveguide mode (near field pattern), weak waveguide lasers having a thin active layer and separate confinement type lasers called large optical cavity (LOC) structure have been studied.

In such structures, however, since there is a close correlation between the band gap and refractive index of each mixed crystal system such as AlGaAs compound, carrier confinement and light confinement into a waveguide cannot be controlled independently.

In particular, whether in weak waveguiding laser or in LOC structure laser, in order to get a higher output, a thin active layer is needed for expanding a waveguide mode, whereas a thicker active layer is needed to obtain a high gain for laser oscillation in an expanded waveguide mode, and because of such contradiction, actually, the mode expansion in the epitaxial direction by such technique is limited to about 1 µm at most, and its output is limited at about 100 mW for single mode.

In the weak waveguide laser having a thin active layer, since the waveguide mode in the epitaxy direction has an inverted-V profile with exponential tails, the radiation density in the active layer where COD may occur is higher for certain entire beam intensity, and it is not only disadvantageous for higher output, but also growth of a relatively thick cladding layer is needed because the waveguide mode draws a deep tail into the cladding layer.

Moreover, in both waveguide mode and radiation pattern (far field pattern), there is a large deviation from the ideal Gaussian beam, and the beam focusing characteristics presents a problem in many applications.

Studies have been also made into the so-called window structure for making the vicinity of the exit facet where COD may occur transparent to the laser exit beam, and the laser with the structure for not injecting carrier near the facet. These structures are generally complicated in manufacturing process, and are increased in astigmatism, among other problems.

It is also attempted to fabricate a single-mode high-power laser by optical feedback among multiple semiconductor lasers, but the device is complicated and other problems are involved.

SUMMARY OF THE INVENTION

In the light of the recent background that multiple thin layers can be easily formed by MBE (molecular beam epitaxy) method, MOCVD (metal organic chemical vapor deposition) method, and others, it is hence a primary object of the invention to overcome the dilemma on device design in control of waveguide mode experienced in the conventional weak waveguide laser and LOC structure laser, realize higher output and lower divergence of radiation beam, and improve the waveguide mode.

The invention has the following means to achieve the object.

That is, in a semiconductor laser device, on both sides of an active layer, carrier blocking layers for reducing the waveguiding function of the active layer are provided, and waveguide layers are provided on both outer sides of the carrier blocking layers, and cladding layers are provided on both outer sides of the waveguide layers. The active layer is a lamination of side barrier layers and a quantum well layer sandwiched therebetween, or a lamination of outermost side barrier layers, and at least two quantum well layers and a barrier layer sandwiched between adjacent quantum well layers, the composition of each quantum well layer is $Ga_yIn_{1-y}As$ (0.6<y<1.0), and the carrier blocking layer is made of a material having a wider band gap and a lower refractive index than the material for the adjacent waveguide layer.

Herein, it is difficult to determine the refractive index by directly measuring in a thin layer state. Accordingly, a bulk value is used for the refractive index of the AlGaAs layers. This value is mentioned, for example, in the publication, Journal of Applied Physics (USA), Vol. 60, No. 2, 15 Jul., 1986, P.754–767.

As for GaInAs, there is no detailed data about dependence of the refractive index in bulk on the wavelength and composition, but it can be determined, for example, by one of the following methods. That is, (1) a bulk is prepared and measured, (2) it is estimated from the band gap of GaInAs, and (3) the refractive index is determined so as to be fitted by calculation with the radiation pattern (far field pattern) of output light of the semiconductor laser using the quantum well layer of GaInAs.

The invention also provides a semiconductor laser device, in which carrier blocking layers are provided on both outer sides of an active layer formed in a vertical direction from the device surface, the active layer is a lamination of side barrier layers and a quantum well layer sandwiched therebetween, or side barrier layers, and a quantum well layer and a barrier layer sandwiched therebetween, waveguide layers are provided on both outer sides of the carrier blocking layer, cladding layers are provided on both outer sides of the waveguide layers, the composition of the quantum well layer is $Al_xGa_{1-x}As$ (0≦x≦0.2) or $Ga_zIn_{1-z}As$ (0.6<z<1.0), the composition of the carrier blocking layer is $Al_xGa_{1-x}As$ or $(Al_yGa_{1-y})_zIn_{1-z}P$ (0≦y<0.3, 0.20≦z≦0.83), and the waveguide layer and cladding layer are made of GaAs or mixed crystal semiconductor of AlAs and GaAs.

In this constitution, carrier blocking layers having a sufficient height for confining the carrier into the active layer are provided on both sides of the active layer of the quantum well laser. The composition of the carrier blocking layer is $Al_xGa_{1-x}As$ or $(Al_yGa_{1-y})_zIn_{1-z}P$, where the range of y is desired to be 0≦y<0.3, and z to be 0.20≦z≦0.83, and x can be restricted by Al content of wave guide layer.

By employing $(Al_yGa_{1-y})_zIn_{1-z}P$ composition, as compared with $Al_xGa_{1-x}As$ having the same block height, the content of Al is less, and elevation of power level for initiating COD is expected. Further, the band gap of $Al_xGa_{1-x}As$ is 2.2 eV (when x=1.0) at maximum, while that of $(Al_yGa_{1-y})_{0.51}In_{0.49}P$ is 2.4 eV even in the direct band gap region, so that it can cope with the shortening of oscillation wavelength. $(Al_yGa_{1-y})_{0.51}In_{0.49}P$ is lattice-matched with GaAs, but lattice-mismatching $(Al_zGa_{1-y})_zIn_{1-z}P$), needless to say, is valid as far as z is in a range of 0.20 to 0.83, i.e., in strained super-lattice scheme not causing lattice relaxation.

When the thicknesses of the active layer region and carrier blocking layer is set to be small enough compared with the oscillation wavelength, the waveguiding functions of the active layer region and carrier blocking layer can be canceled out. In such conditions, the waveguide layer and cladding layers having a low refractive index on both sides of waveguide layer or a wide waveguiding layers composed of linear or quadratic graded index structure are formed only for the control of light guide. As a result, designing the waveguide mode completely independent of the active layer design parameter, is possible, so that a waveguide mode close to a Gaussian beam of high output and low divergence angle may be obtained.

In the conventional structure, in order to have a higher output of the quantum well semiconductor laser by avoiding COD of the facet or to reduce the beam radiation divergence angle, it is necessary to expand the waveguide mode by setting to so-called weak waveguide. In the optical gain in the active layer, however, there is a certain limit as seen in the gain saturation of the quantum well laser, for example. Accordingly, for maintaining the oscillation in the expanded waveguide mode, as a matter of course, further multilayering of the quantum well is required, and it causes contradiction with the weak waveguide structure, and hence it was a dilemma in the designing the laser diode of high output and low radiation beam angle.

Owing to the presence of the carrier blocking layer possessing the anti-waveguide function, the number of quantum wells for giving an optical gain necessary for its oscillation can be set independently of the weak waveguide forming. In particular, after canceling the waveguiding function of the active layer region with the anti-waveguiding function of the carrier blocking layer, it is possible to introduce a waveguide mode control structure having a refractive index distribution of stepped, linear or quadratic curve as shown in FIGS. 1A–1C, separately in the waveguide layer.

In this carrier blocking layer, by doping about $10^{18}/cm^3$ of p-type dopant on p-side and n-type dopant on n-side, the effective carrier blocking and the reduction of electric resistance due to the Schottky barrier at the band discontinuities are achieved.

More specifically, the cancellation of the waveguiding functions around the active layer region is considered as follows.

The normalized frequency $V_0$ as an index to the waveguiding function of the active layer is defined as the following formula.

$$V_0 = \pi \cdot d_1/\lambda \cdot (N_1^2 - N_0^2)^{0.5}$$

In the case of a multi-quantum well having m quantum well layers, the normalization frequency $V_0$ is defined as the following formula.

$$V_0 = m \cdot \pi \cdot d_1/\lambda \cdot (N_1^2 - N_0^2)^{0.5}$$

On the other hand, the index $V_1$ to the anti-waveguiding function of a carrier blocking layer having a low refractive index is defined as the following formula.

$$V_1 = \pi \cdot d_2/\lambda \cdot (N_0^2 - N_2^2)^{0.5},$$

where $\pi$ is the ratio of the circumference of a circle to its diameter, $\lambda$ is the oscillation wavelength, $N_0$ is the refractive index of waveguide layer (the maximum value is employed where there is a refractive index distribution in the waveguide layer), $d_1$ is the thickness of a quantum well layer, $N_1$ is the refractive index of quantum well layer, $d_2$ is the thickness of carrier blocking layer, and $N_2$ is the refractive index of carrier blocking layer.

$V_0 = 2V_1$ is a requirement for the cancellation of the waveguide functions of the active layer and carrier blocking layer, and when $|2V_1 - V_0| < V_1$, that is $V_0/3 < V_1 < V_0$, the cancellation is nearly realized.

When the waveguiding functions of the active layer and carrier blocking layer are canceled, the waveguide mode can be independently controlled by the surrounding waveguide layer and cladding layer. In any structure as shown in Figs. 1A–1C, the cut-off status for higher mode is desired for the sake of single mode oscillation. Concerning the waveguide structure of step index type in FIG. 1A, this waveguide mode can be described by normalized frequency $V_2$, and $V_2$ can be defined in the following formula.

$$V_2 = \pi \cdot d_3/\lambda \cdot (N_0^2 - N_3^2)^{0.5}$$

where $\pi$ is the ratio of the circumference of a circle to its diameter, $\lambda$ is the oscillation wavelength, $d_3$ is the thickness between both cladding layers, and $N_3$ is the refractive index of cladding layer. Incidentally, since the waveguide mode is a sine-functional profile in the waveguide core layer, and exponential tails into the cladding layers, the waveguide mode is brought close to the Gaussian function with the increase of the normalization frequency $V_2$. In the symmetric slab waveguide, when the normalization frequency $V_2$ is less than $\pi/2$, it is a single-mode waveguide. In the waveguide structure close to symmetry, the probability of excitation of odd-number order mode is almost nil, and therefore by raising the normalization frequency V further up to about $\pi$ to bring the mode closer to the Gaussian profile, the same effect is obtained without inducing odd-number order mode oscillation. In all embodiments, $V_2$ is designed to be close to $\pi$. Even in the case of $V_2 > \pi$, fundamental mode oscillation will be obtained, since higher order modes have additional coupling loss with the substrate and cap layer (actually, in all embodiments with $V_2 = 1.17\pi$, we observed fundamental mode oscillation).

Therefore, fundamental mode operation with near Gaussian profiles will be realized in the range, $\pi/3 < V_2 < 2\pi$.

By calculating the waveguide mode in the multi-layered structure, a waveguide mode close to the Gaussian profile, nearly realized under the condition of $V_1 < V_2/10$.

Furthermore, by the use of the graded index structure as shown in FIGS. 1B, 1C, the oscillation mode can be further brought closer to the Gaussian profile.

The carrier blocking layer must confine the carrier effectively in the active layer. The inventors repeatedly fabricated trial semiconductor lasers and discovered that, when the composition of the carrier blocking layer is $Al_{z+dz}Ga_{1-z-dz}As$, and the composition of the waveguide layer is $Al_zGa_{1-z}As$ (when z is changing, the minimum value is employed), and the thickness of the carrier blocking layer is $d_2$ (angstroms), the carrier can be effectively confined in the active layer on condition that $$dz > 2.2 \times 10^3/d_2^2.$$

At the same time, the near Gaussian mode profile condition $$V_1 < V_2/10$$

can be expressed by using dz, $d_2$ as follows $dz<5.0\times10^4/d_2^2$

Owing to this effect, as compared with the conventional separated confinement hetero-structure (SCH), a cladding layer with a lower Al content is realized.

Furthermore, the inventors repeatedly fabricated trial semiconductor lasers having a carrier blocking layer of $(Al_yGa_{1-y})_xIn_{1-x}P$ and as a result found that more generally, when the relationship of the energy gap $E_{gs}$(eV) of carrier blocking layer, thickness $d_2$ (angstroms) of carrier blocking layer, and energy gap $E_{gd}$ of waveguide layer (eV, the minimum value is employed where there is a distribution in energy gap) is as follows $E_{gs}-E_{gd}>2.5\times10^3/d_2^2$, the carrier can be sufficiently and effectively confined in the active layer. Besides, the near Gaussian mode profile condition $V_1<V_2/10$ is, by using $E_{gs}$, $E_{gd}$, $d_2$, expressed as follows:

$E_{gs}·E_{gd}<6.2\times10^4/d_2^2$

Owing to this effect, as compared with the conventional structure of SCH, a cladding layer of lower Al content is realized.

The thickness and composition of carrier blocking layers of p-type and n-type are not always required to be equal to each other. In this case, supposing $V_1$ of the p-type carrier blocking layer to be $V_{1p}$, and $V_1$ of the n-type carrier blocking layer to be $V_{1n}$, and expressing as follows $V_1=(V_{1p}+V_{1n})/2.0$ the above discussion can be applied directly.

The action of the carrier blocking layer having large band gap, low refractive index and an anti-waveguiding function, provided on both sides of the active layer, serves to reduce or cancel the waveguiding function of active layer. Another function is to block the injected carrier, and confine the electrons and holes into the active layer. By p-doping or n-doping in this layer, it is possible to reduce the electric resistance and enhance the carrier confinement performance.

In this invention, meanwhile, since the carrier blocking layer effectively blocks the carrier, the Al composition of the $Al_xGa_{1-x}As$ semiconductor, especially used in the wavequide layer, can be set lower and can be set to $0\leq x\leq0.20$ when the composition of quantum layer is GaInAs and it contributes greatly to reduction of electric resistance and thermal resistance (see FIGS. 15 and 16), and the chemical stability is increased at the same time. The fabrication process is facilitated.

The invention hence enables to fabricate a semiconductor laser having a proper beam profile and high efficiency at a low radiation beam angle. Besides, it is possible to fabricate a high power semiconductor laser with a simple structure while avoiding COD on the end face. At the same time, since the electric resistance and thermal resistance are low, it is possible to operate at a high current density.

BRIEF DESCRIPTION OF THE DRAWINGS

Other and further objects, features, and advantages of the invention will be more explicit from the following detailed description taken with reference to the drawings wherein:

FIGS. 1A–1C are schematic sectional views in the epitaxial direction showing the structure of a semiconductor laser of the invention;

DETAILED DESCRIPTION OF THE PREFERRED EMBODIMENTS

Figure 2A:
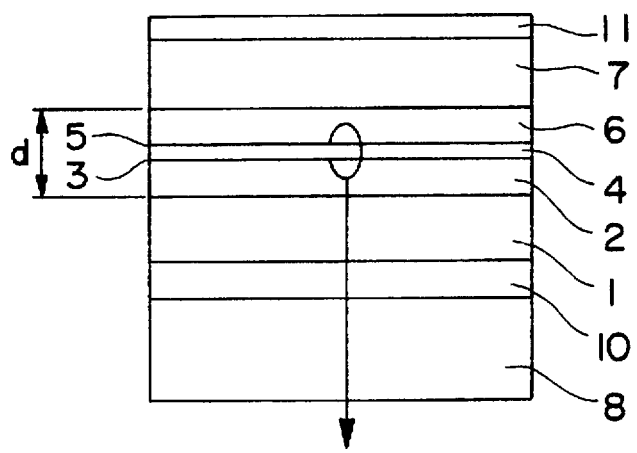
FIGS. 2A and 2B is a schematic sectional view showing the structure of examples 1–52 of the invention and comparative example 4.

Now referring to the drawings, preferred embodiments of the invention are described below.

Semiconductor lasers of examples 1 to 52 and comparative examples 1 to 4 manufactured by the MOCVD semiconductor thin layer manufacturing apparatus are structured as follows.

Figure 2B:
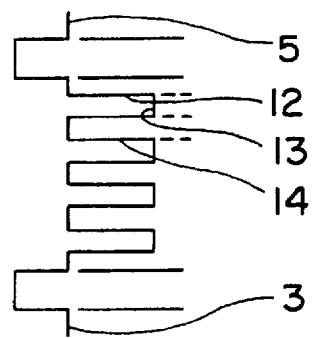

First the structure common to examples 1 to 52 is described. As shown in FIG. 2, on an n-type substrate 8 composed of GaAs, an n-type buffer layer 10 of 0.5 µm in thickness was formed, and an n-type cladding layer 1, an n-type waveguide layer 2, an n-type carrier blocking layer 3, an active layer 4, a p-type carrier blocking layer 5, a p-type waveguide layer, a p-type waveguide layer 6, and a p-type cladding layer 7 were sequentially formed thereon, and an n-type cap layer 11 was formed as the top layer.

Figure 3A:
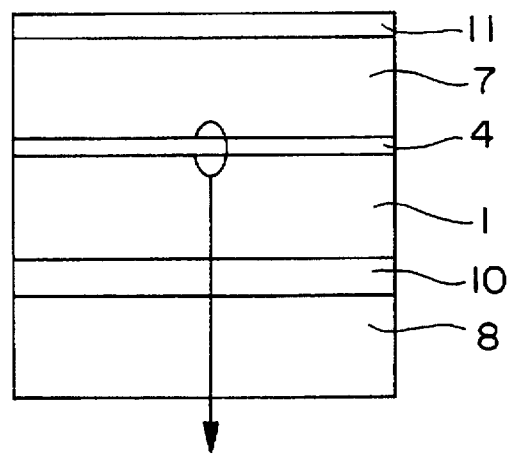
FIG. 3 is a schematic sectional view showing the structure of comparative examples 1–3 of the invention.
Figure 3B:
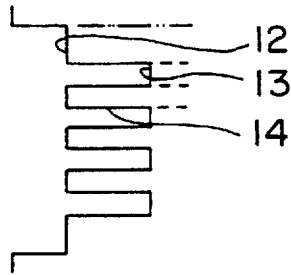

In examples 1 to 17, the specific constitution of each layer is as follows.

n-type cap layer 11 Thickness: 0.3 μm Composition: GaAs p-type cladding layer 7 Thickness: 1.0 μm Composition: $Al_{0.15}Ga_{0.85}As$ p-type waveguide layer 6 Thickness: 0.80 μm Composition: $Al_{0.05}Ga_{0.95}As$ n-type waveguide layer 2 Thickness: 0.80 μm Composition: $Al_{0.05}Ga_{0.95}As$ n-type cladding layer 1 Thickness: 1.0 μm Composition: $Al_{0.15}Ga_{0.85}As$ n-type buffer layer 10 Thickness: 0.5 μm Composition: GaAs n-type substrate 8 Composition: (100)GaAs In examples 18 to 34 and comparative example 4, the specific constitution of each layer is as follows.

n-type cap layer 11 Thickness: 0.3 μm Composition: GaAs p-type cladding layer 7 Thickness: 1.0 μm Composition: $Al_{0.32}Ga_{0.58}As$ p-type waveguide layer 6 Thickness: 0.40 μm Composition: $Al_{0.25}Ga_{0.75}As$ n-type waveguide layer 2 Thickness: 0.40 μm Composition: $Al_{0.25}Ga_{0.75}As$ n-type cladding layer 1 Thickness: 1.0 μm Composition: $Al_{0.32}Ga_{0.68}As$ n-type buffer layer 10 Thickness: 0.5 μm Composition: GaAs n-type substrate Composition: (100)GaAs In example 35, the specific constitution of each layer is as follows.

n-type cap layer 11 Thickness: 0.3 μm Composition: GaAs p-type cladding layer 7 Thickness: 1.0 μm Composition: $Al_{0.57}Ga_{0.43}As$ p-type waveguide layer 6 Thickness: 0.40 μm Composition: $Al_{0.50}Ga_{0.50}As$ n-type waveguide layer 2 Thickness: 0.40 μm Composition: $Al_{0.50}Ga_{0.50}As$ n-type cladding layer 1 Thickness: 1.0 μm Composition: $Al_{0.57}Ga_{0.43}As$ n-type buffer layer 10 Thickness: 0.5 μm Composition: GaAs n-type substrate 8 Composition: (100)GaAs The structure of comparative examples 1 and 2 is shown in FIG. 3. On an n-type substrate 8 composed of GaAs, an n-type buffer layer 10 of 0.5 μm in thickness was formed, and an n-type cladding layer 1, an active layer 4, and a p-type cladding layer 7 were sequentially formed thereon, and an n-type cap layer 11 was formed as the top layer.

In comparative example 1, the specific constitution of each layer is as follows.

n-type cap layer 11 Thickness: 0.3 μm Composition: GaAs p-type cladding layer 7 Thickness: 1.5 μm Composition: $Al_{0.22}Ga_{0.78}As$ n-type cladding layer 1 Thickness: 1.5 μm Composition: $Al_{0.22}Ga_{0.78}As$ n-type buffer layer 10 Thickness: 0.5 μm Composition: GaAs n-type substrate 8 Composition: (100)GaAs In comparative example 2, the specific constitution of each layer is as follows.

n-type cap layer 11 Thickness: 0.3 μm Composition: GaAs p-type cladding layer 7 Thickness: 1.5 μm Composition: $Al_{0.65}Ga_{0.35}As$ n-type cladding layer 1 Thickness: 1.5 μm Composition: $Al_{0.65}Ga_{0.35}As$ n-type buffer layer 10 Thickness: 0.5 μm Composition: GaAs n-type substrate 8 Composition: (100)GaAs In examples 1 to 35, the active layer 4 is formed in a region enclosed by the p-type carrier blocking layer 5 and n-type carrier blocking layer 3, with four quantum well layers 13 isolated by three barrier layers 14, between side barrier layers 12 provided at inner wall side of the carrier blocking layers 5, 3. In the comparative examples, the active layer 4 is formed in a region enclosed by side barriers 12, with four quantum well layers 13 isolated by three barrier layers 14. The specific constitution of the p-type carrier blocking layer 5, n-type carrier blocking layer 3, and active layer 4 differs in each example and comparative example, and is explained by referring to Tables 1–13.

TABLE 1

| Layer | Example 1 | Example 2 | Example 3 |
| --- | --- | --- | --- |
| P-type carrier blocking layer 5 (yes/no) | yes | yes | yes |
| Thickness (angstroms) | 80 | 200 | 500 |
| Composition: $Al_xGa_{1-x}As$ | x = 0.1 | x = 0.1 | x = 0.1 |
| Side barrier layer 12 | yes | yes | yes |
| Thickness (angstroms) | 500 | 500 | 500 |
| Composition: $Al_xGa_{1-x}As$ | x = 0.05 | x = 0.05 | x = 0.05 |
| Quantum well layer 13 | yes | yes | yes |
| Quantity of layer | 4 | 4 | 4 |
| Thickness (angstroms) | 80 | 80 | 80 |
| Composition: $Ga_yIn_{1-y}As$ | y = 0.8 | y = 0.8 | y = 0.8 |
| Barrier layer 14 | yes | yes | yes |
| Thickness (angstroms) | 50 | 50 | 50 |
| Composition: $Al_xGa_{1-x}As$ | x = 0.05 | x = 0.05 | x = 0.05 |
| N-type carrier blocking layer 3 (yes/no) | yes | yes | yes |
| Thickness (angstroms) | 80 | 200 | 500 |
| Composition: $Al_xGa_{1-x}As$ | x = 0.1 | x = 0.1 | x = 0.1 |

TABLE 2

| Layer | Example 4 | Example 5 | Example 6 |
| --- | --- | --- | --- |
| P-type carrier blocking layer 5 (yes/no) | yes | yes | yes |
| Thickness (angstroms) | 80 | 150 | 300 |
| Composition: $Al_xGa_{1-x}As$ | x = 0.2 | x = 0.2 | x = 0.2 |
| Side barrier layer 12 | yes | yes | yes |
| Thickness (angstroms) | 500 | 500 | 500 |
| Composition: $Al_xGa_{1-x}As$ | x = 0.05 | x = 0.05 | x = 0.05 |
| Quantum well layer 13 | yes | yes | yes |
| Quantity of layer | 4 | 4 | 4 |
| Thickness (angstroms) | 80 | 80 | 80 |
| Composition: $Ga_yIn_{1-y}As$ | y = 0.8 | y = 0.8 | y = 0.8 |
| Barrier layer 14 | yes | yes | yes |
| Thickness (angstroms) | 50 | 50 | 50 |
| Composition: $Al_xGa_{1-x}As$ | x = 0.05 | x = 0.05 | x = 0.05 |
| N-type carrier blocking layer 3 (yes/no) | yes | yes | yes |
| Thickness (angstroms) | 80 | 150 | 300 |
| Composition: $Al_xGa_{1-x}As$ | x = 0.2 | x = 0.2 | x = 0.2 |

TABLE 3

| Layer | Example 7 | Example 8 | Example 9 |
|---|---|---|---|
| P-type carrier blocking layer 5 (yes/no) | yes | yes | yes |
| Thickness (angstroms) | 500 | 750 | 50 |
| Composition: $Al_xGa_{1-x}As$ | x = 0.2 | x = 0.2 | x = 0.3 |
| Side barrier layer 12 | yes | yes | yes |
| Thickness (angstroms) | 500 | 500 | 500 |
| Composition: $Al_xGa_{1-x}As$ | x = 0.05 | x = 0.05 | x = 0.05 |
| Quantum well layer 13 | yes | yes | yes |
| Quantity of layer | 4 | 4 | 4 |
| Thickness (angstroms) | 80 | 80 | 80 |
| Composition: $Ga_yIn_{1-y}As$ | y = 0.8 | y = 0.8 | y = 0.8 |
| Barrier layer 14 | yes | yes | yes |
| Thickness (angstroms) | 50 | 50 | 50 |
| Composition: $Al_xGa_{1-x}As$ | x = 0.05 | x = 0.05 | x = 0.05 |
| N-type carrier blocking layer 3 (yes/no) | yes | yes | yes |
| Thickness (angstroms) | 500 | 750 | 50 |
| Composition: $Al_xGa_{1-x}As$ | x = 0.2 | x = 0.2 | x = 0.3 |

TABLE 4

| Layer | Example 10 | Example 11 | Example 12 |
|---|---|---|---|
| P-type carrier blocking layer 5 (yes/no) | yes | yes | yes |
| Thickness (angstroms) | 100 | 200 | 300 |
| Composition: $Al_xGa_{1-x}As$ | x = 0.3 | x = 0.3 | x = 0.3 |
| Side barrier layer 12 | yes | yes | yes |
| Thickness (angstroms) | 500 | 500 | 500 |
| Composition: $Al_xGa_{1-x}As$ | x = 0.05 | x = 0.05 | x = 0.05 |
| Quantum well layer 13 | yes | yes | yes |
| Quantity of layer | 4 | 4 | 4 |
| Thickness (angstroms) | 80 | 80 | 80 |
| Composition: $Ga_yIn_{1-y}As$ | y = 0.8 | y = 0.8 | y = 0.8 |
| Barrier layer 14 | yes | yes | yes |
| Thickness (angstroms) | 50 | 50 | 50 |
| Composition: $Al_xGa_{1-x}As$ | x = 0.05 | x = 0.05 | x = 0.05 |
| N-type carrier blocking layer 3 (yes/no) | yes | yes | yes |
| Thickness (angstroms) | 100 | 200 | 300 |
| Composition: $Al_xGa_{1-x}As$ | x = 0.3 | x = 0.3 | x = 0.3 |

TABLE 5

| Layer | Example 13 | Example 14 | Example 15 |
|---|---|---|---|
| P-type carrier blocking layer 5 (yes/no) | yes | yes | yes |
| Thickness (angstroms) | 600 | 50 | 100 |
| Composition: $Al_xGa_{1-x}As$ | x = 0.3 | x = 0.4 | x = 0.4 |
| Side barrier layer 12 | yes | yes | yes |
| Thickness (angstroms) | 500 | 500 | 500 |
| Composition: $Al_xGa_{1-x}As$ | x = 0.05 | x = 0.05 | x = 0.05 |
| Quantum well layer 13 | yes | yes | yes |
| Quantity of layer | 4 | 4 | 4 |
| Thickness (angstroms) | 80 | 80 | 80 |
| Composition: $Ga_yIn_{1-y}As$ | y = 0.8 | y = 0.8 | y = 0.8 |
| Barrier layer 14 | yes | yes | yes |
| Thickness (angstroms) | 50 | 50 | 50 |
| Composition: $Al_xGa_{1-x}As$ | x = 0.05 | x = 0.05 | x = 0.05 |
| N-type carrier blocking layer 3 (yes/no) | yes | yes | yes |
| Thickness (angstroms) | 600 | 50 | 100 |
| Composition: $Al_xGa_{1-x}As$ | x = 0.3 | x = 0.4 | x = 0.4 |

TABLE 6

| Layer | Example 16 | Example 17 | Comparative Example 1 |
|---|---|---|---|
| P-type carrier blocking layer 5 (yes/no) | yes | yes | no |
| Thickness (angstroms) | 250 | 600 | — |
| Composition: $Al_xGa_{1-x}As$ | x = 0.4 | x = 0.4 | — |
| Side barrier layer 12 | yes | yes | yes |
| Thickness (angstroms) | 500 | 500 | 500 |
| Composition: $Al_xGa_{1-x}As$ | x = 0.05 | x = 0.05 | x = 0.05 |
| Quantum well layer 13 | yes | yes | yes |
| Quantity of layer | 4 | 4 | 4 |
| Thickness (angstroms) | 80 | 80 | 80 |
| Composition: $Ga_yIn_{1-y}As$ | y = 0.8 | y = 0.8 | y = 0.8 |
| Barrier layer 14 | yes | yes | yes |
| Thickness (angstroms) | 50 | 50 | 50 |
| Composition: $Al_xGa_{1-x}As$ | x = 0.05 | x = 0.05 | x = 0.05 |
| N-type carrier blocking layer 3 (yes/no) | yes | yes | no |
| Thickness (angstroms) | 250 | 600 | — |
| Composition: $Al_xGa_{1-x}As$ | x = 0.4 | x = 0.4 | — |

TABLE 7

| Layer | Example 18 | Example 19 | Example 20 |
|---|---|---|---|
| P-type carrier blocking layer 5 (yes/no) | yes | yes | yes |
| Thickness (angstroms) | 80 | 200 | 500 |
| Composition: $(Al_yGa_{1-y})_{0.51}In_{0.49}P$ | y = 0.0 | y = 0.0 | y = 0.0 |
| Side barrier layer 12 | yes | yes | yes |
| Thickness (angstroms) | 500 | 500 | 500 |
| Composition: $Al_xGa_{1-x}As$ | x = 0.25 | x = 0.25 | x = 0.25 |
| Quantum well layer 13 | yes | yes | yes |
| Quantity of layer | 4 | 4 | 4 |
| Thickness (angstroms) | 50 | 50 | 50 |
| Composition: $Al_xGa_{1-x}As$ | x = 0 | x = 0 | x = 0 |
| Barrier layer 14 | yes | yes | yes |
| Thickness (angstroms) | 50 | 50 | 50 |
| Composition: $Al_xGa_{1-x}As$ | x = 0.25 | x = 0.25 | x = 0.25 |
| N-type carrier blocking layer 3 (yes/no) | yes | yes | yes |
| Thickness (angstroms) | 80 | 200 | 500 |
| Composition: $(Al_yGa_{1-y})_{0.51}In_{0.49}P$ | y = 0.0 | y = 0.0 | y = 0.0 |

TABLE 8

| Layer | Example 21 | Example 22 | Example 23 |
|---|---|---|---|
| P-type carrier blocking layer 5 (yes/no) | yes | yes | yes |
| Thickness (angstroms) | 80 | 150 | 300 |
| Composition: $(Al_yGa_{1-y})_{0.51}In_{0.49}P$ | y = 0.04 | y = 0.04 | y = 0.04 |
| Side barrier layer 12 | yes | yes | yes |
| Thickness (angstroms) | 500 | 500 | 500 |
| Composition: $Al_xGa_{1-x}As$ | x = 0.25 | x = 0.25 | x = 0.25 |
| Quantum well layer 13 | yes | yes | yes |
| Quantity of layer | 4 | 4 | 4 |
| Thickness (angstroms) | 50 | 50 | 50 |
| Composition: $Al_xGa_{1-x}As$ | x = 0 | x = 0 | x = 0 |
| Barrier layer 14 | yes | yes | yes |
| Thickness (angstroms) | 50 | 50 | 50 |
| Composition: $Al_xGa_{1-x}As$ | x = 0.25 | x = 0.25 | x = 0.25 |
| N-type carrier blocking layer 3 (yes/no) | yes | yes | yes |
| Thickness (angstroms) | 80 | 150 | 300 |
| Composition: $(Al_yGa_{1-y})_{0.51}In_{0.49}P$ | y = 0.04 | y = 0.04 | y = 0.04 |

TABLE 9

| Layer | Example 24 | Example 25 | Example 26 |
|---|---|---|---|
| P-type carrier blocking layer 5 (yes/no) | yes | yes | yes |
| Thickness (angstroms) | 500 | 750 | 50 |
| Composition: $(Al_yGa_{1-y})_{0.51}In_{0.49}P$ | $y = 0.04$ | $y = 0.04$ | $y = 0.08$ |
| Side barrier layer 12 | yes | yes | yes |
| Thickness (angstroms) | 500 | 500 | 500 |
| Composition: $Al_xGa_{1-x}As$ | $x = 0.25$ | $x = 0.25$ | $x = 0.25$ |
| Quantum well layer 13 | yes | yes | yes |
| Quantity of layer | 4 | 4 | 4 |
| Thickness (angstroms) | 50 | 50 | 50 |
| Composition: $Al_xGa_{1-x}As$ | $x = 0$ | $x = 0$ | $x = 0$ |
| Barrier layer 14 | yes | yes | yes |
| Thickness (angstroms) | 50 | 50 | 50 |
| Composition: $Al_xGa_{1-x}As$ | $x = 0.25$ | $x = 0.25$ | $x = 0.25$ |
| N-type carrier blocking layer 3 (yes/no) | yes | yes | yes |
| Thickness (angstroms) | 500 | 750 | 50 |
| Composition: $(Al_yGa_{1-y})_{0.51}In_{0.49}P$ | $y = 0.04$ | $y = 0.04$ | $y = 0.08$ |

TABLE 10

| Layer | Example 27 | Example 28 | Example 29 |
|---|---|---|---|
| P-type carrier blocking layer 5 (yes/no) | yes | yes | yes |
| Thickness (angstroms) | 100 | 200 | 300 |
| Composition: $(Al_yGa_{1-y})_{0.51}In_{0.49}P$ | $y = 0.08$ | $y = 0.08$ | $y = 0.08$ |
| Side barrier layer 12 | yes | yes | yes |
| Thickness (angstroms) | 500 | 500 | 500 |
| Composition: $Al_xGa_{1-x}As$ | $x = 0.25$ | $x = 0.25$ | $x = 0.25$ |
| Quantum well layer 13 | yes | yes | yes |
| Quantity of layer | 4 | 4 | 4 |
| Thickness (angstroms) | 50 | 50 | 50 |
| Composition: $Al_xGa_{1-x}As$ | $x = 0$ | $x = 0$ | $x = 0$ |
| Barrier layer 14 | yes | yes | yes |
| Thickness (angstroms) | 50 | 50 | 50 |
| Composition: $Al_xGa_{1-x}As$ | $x = 0.25$ | $x = 0.25$ | $x = 0.25$ |
| N-type carrier blocking layer 3 (yes/no) | yes | yes | yes |
| Thickness (angstroms) | 100 | 200 | 300 |
| Composition: $(Al_yGa_{1-y})_{0.51}In_{0.49}P$ | $y = 0.08$ | $y = 0.08$ | $y = 0.08$ |

TABLE 11

| Layer | Example 30 | Example 31 | Example 32 |
|---|---|---|---|
| P-type carrier blocking layer 5 (yes/no) | yes | yes | yes |
| Thickness (angstroms) | 600 | 50 | 100 |
| Composition: $(Al_yGa_{1-y})_{0.51}In_{0.49}P$ | $y = 0.08$ | $y = 0.12$ | $y = 0.12$ |
| Side barrier layer 12 | yes | yes | yes |
| Thickness (angstroms) | 500 | 500 | 500 |
| Composition: $Al_xGa_{1-x}As$ | $x = 0.25$ | $x = 0.25$ | $x = 0.25$ |
| Quantum well layer 13 | yes | yes | yes |
| Quantity of layer | 4 | 4 | 4 |
| Thickness (angstroms) | 50 | 50 | 50 |
| Composition: $Al_xGa_{1-x}As$ | $x = 0$ | $x = 0$ | $x = 0$ |
| Barrier layer 14 | yes | yes | yes |
| Thickness (angstroms) | 50 | 50 | 50 |
| Composition: $Al_xGa_{1-x}As$ | $x = 0.25$ | $x = 0.25$ | $x = 0.25$ |
| N-type carrier blocking layer 3 (yes/no) | yes | yes | yes |
| Thickness (angstroms) | 600 | 50 | 100 |
| Composition: $(Al_yGa_{1-y})_{0.51}In_{0.49}P$ | $y = 0.08$ | $y = 0.12$ | $y = 0.12$ |

TABLE 12

| Layer | Example 33 | Example 34 | Example 35 |
|---|---|---|---|
| P-type carrier blocking layer 5 (yes/no) | yes | yes | yes |
| Thickness (angstroms) | 250 | 600 | 200 |
| Composition: $(Al_yGa_{1-y})_{0.51}In_{0.49}P$ | $y = 0.12$ | $y = 0.12$ | $y = 0.25$ |
| Slide barrier layer 12 | yes | yes | yes |
| Thickness (angstroms) | 500 | 500 | 500 |
| Composition: $Al_xGa_{1-x}As$ | $x = 0.25$ | $x = 0.25$ | $x = 0.50$ |
| Quantum well layer 13 | yes | yes | yes |
| Quantity of layer | 4 | 4 | 4 |
| Thickness (angstroms) | 50 | 50 | 50 |
| Composition: $Al_xGa_{1-x}As$ | $x = 0$ | $x = 0$ | $x = 0.20$ |
| Barrier layer 14 | yes | yes | yes |
| Thickness (angstroms) | 50 | 50 | 50 |
| Composition: $Al_xGa_{1-x}As$ | $x = 0.25$ | $x = 0.25$ | $x = 0.50$ |
| N-type carrier blocking layer 3 (yes/no) | yes | yes | yes |
| Thickness (angstroms) | 250 | 600 | 200 |
| Composition: $(Al_yGa_{1-y})_{0.51}In_{0.49}P$ | $y = 0.12$ | $y = 0.12$ | $y = 0.25$ |

TABLE 13

| Layer | Comperative Example 2 | Comparative Example 4 |
|---|---|---|
| P-type carrier blocking layer 5 (yes/no) | no | yes |
| Thickness (angstroms) | — | 250 |
| Composition: $(Al_yGa_{1-y})_{0.51}In_{0.49}P$- | — | $Al_{0.5}Ga_{0.5}As$ |
|  | — | $Al_{0.5}Ga_{0.5}As$ |
| Side barrier layer 12 | yes | yes |
| Thickness (angstroms) | 150 | 500 |
| Composition: $Al_xGa_{1-x}As$ | $x = 0.25$ | $x = 0.25$ |
| Quantum well layer 13 | yes | yes |
| Quantity of layer | 4 | 4 |
| Thickness (angstroms) | 50 | 50 |
| Composition: $Al_xGa_{1-x}As$ | $x = 0$ | $x = 0$ |
| Barrier layer 14 | yes | yes |
| Thickness (angstroms) | 50 | 50 |
| Composition: $Al_xGa_{1-x}As$ | $x = 0.25$ | $x = 0.25$ |
| N-type carrier blocking layer 3 (yes/no) | no | yes |
| Thickness (angstroms) | — | 250 |
| Composition: $(Al_yGa_{1-y})_{0.51}In_{0.49}P$ | — | $Al_{0.5}Ga_{0.5}As$ |

Figure 4:
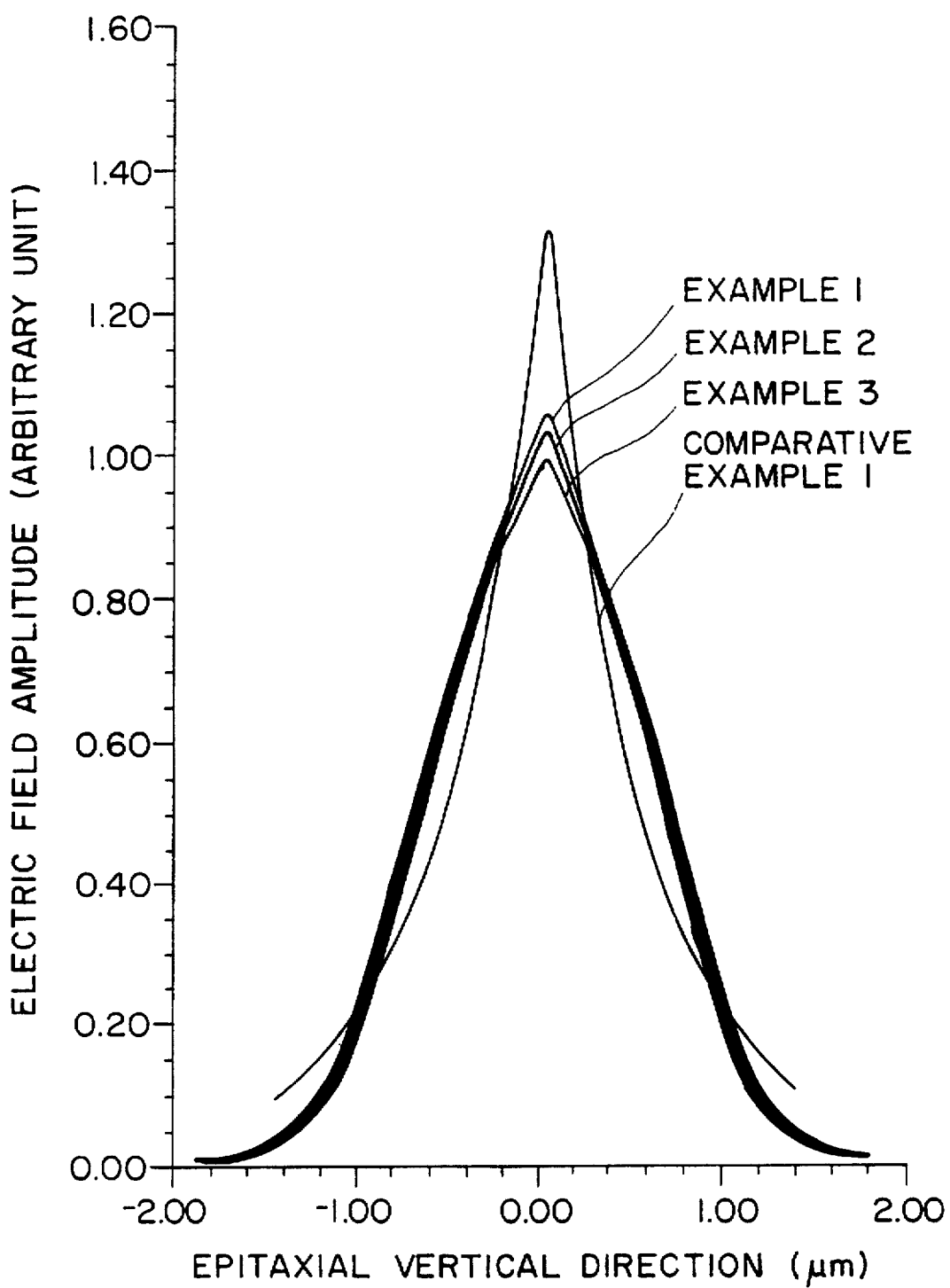
FIG. 4 shows near field patterns of examples 1–3 and comparative example 1 of the invention.
Figure 5:
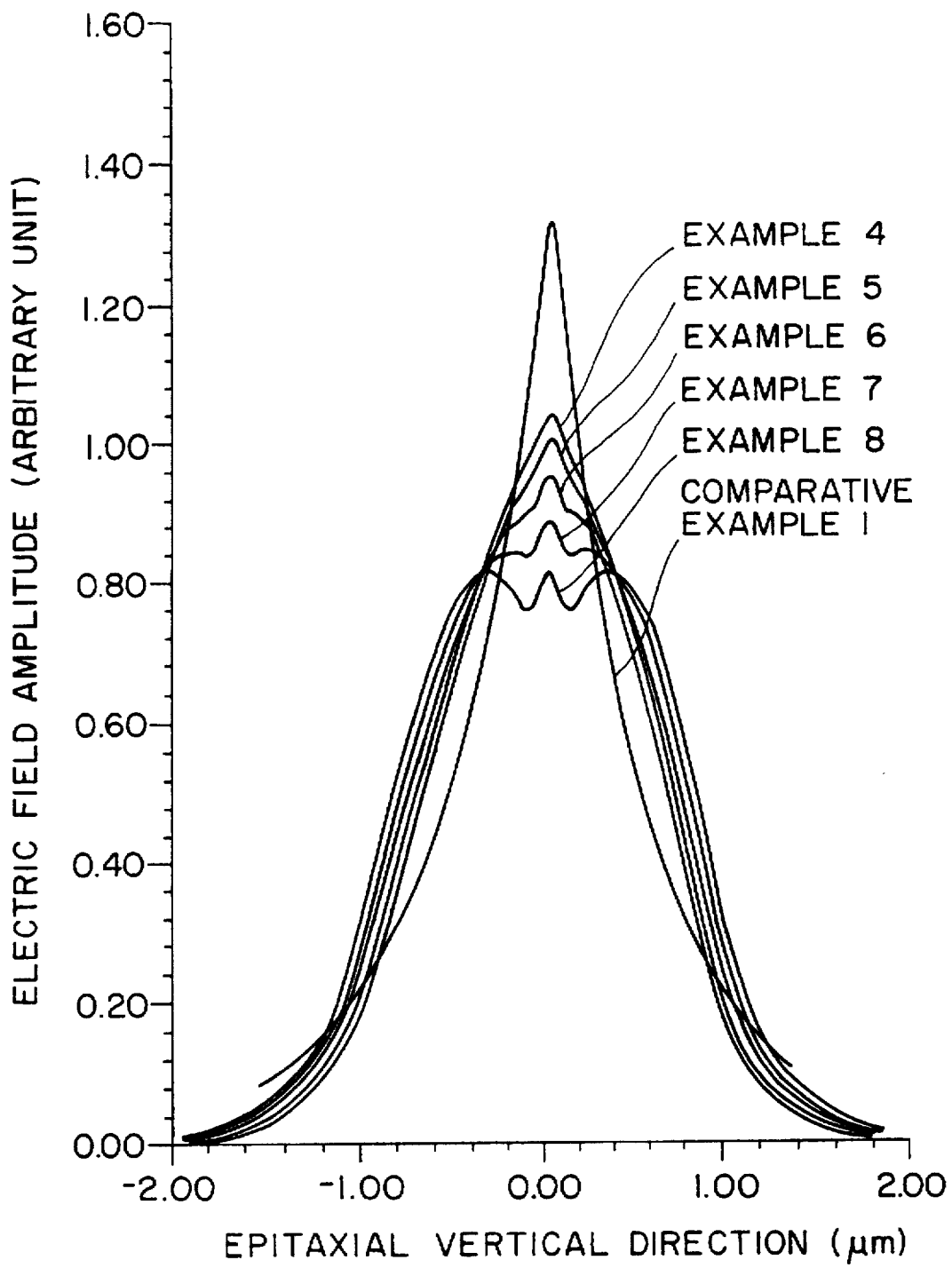
FIG. 5 shows near field patterns of examples 4–8 and comparative example 1 of the invention.
Figure 6:
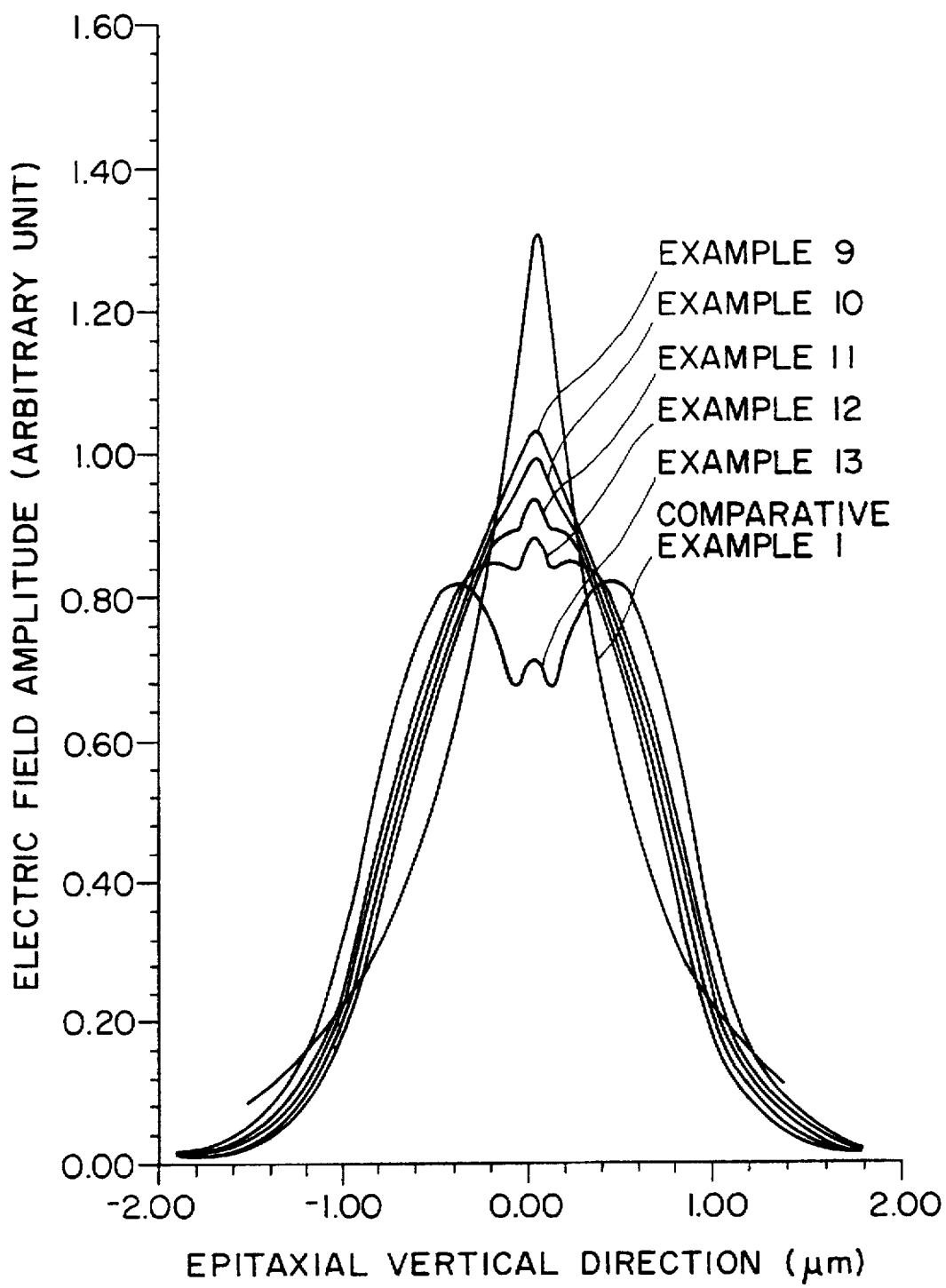
FIG. 6 shows near field patterns of examples 9–13 and comparative example 1 of the invention.
Figure 7:
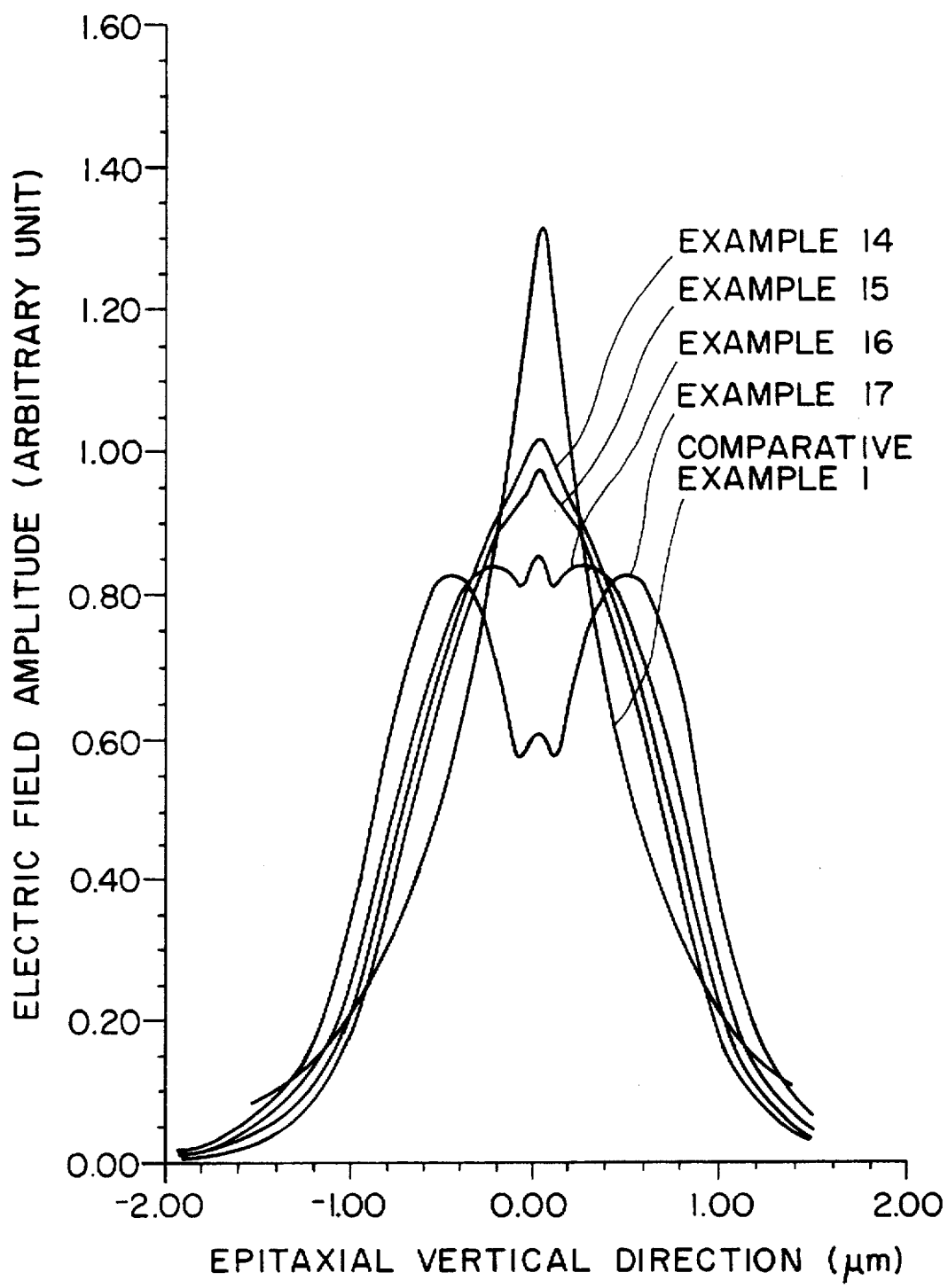
FIG. 7 shows near field patterns of examples 14–17 and comparative example 1 of the invention.
Figure 8:
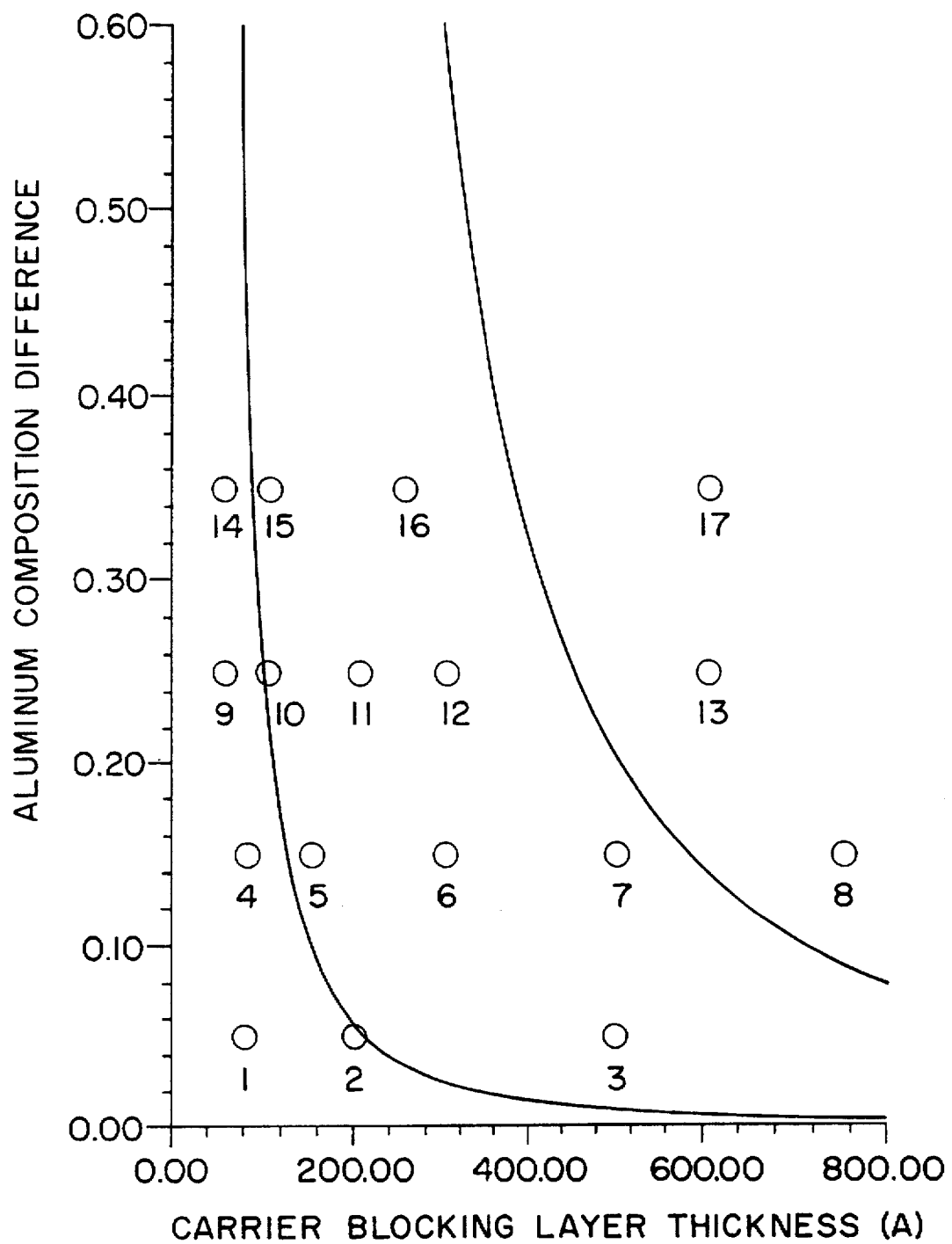
FIG. 8 shows diagram expressing the effective range of the carrier blocking layer, with the width of the carrier blocking layer plotted on the axis of abscissa and the aluminum composition difference between the carrier blocking layer and the waveguide layer on the axis of ordinate.
Figure 9:
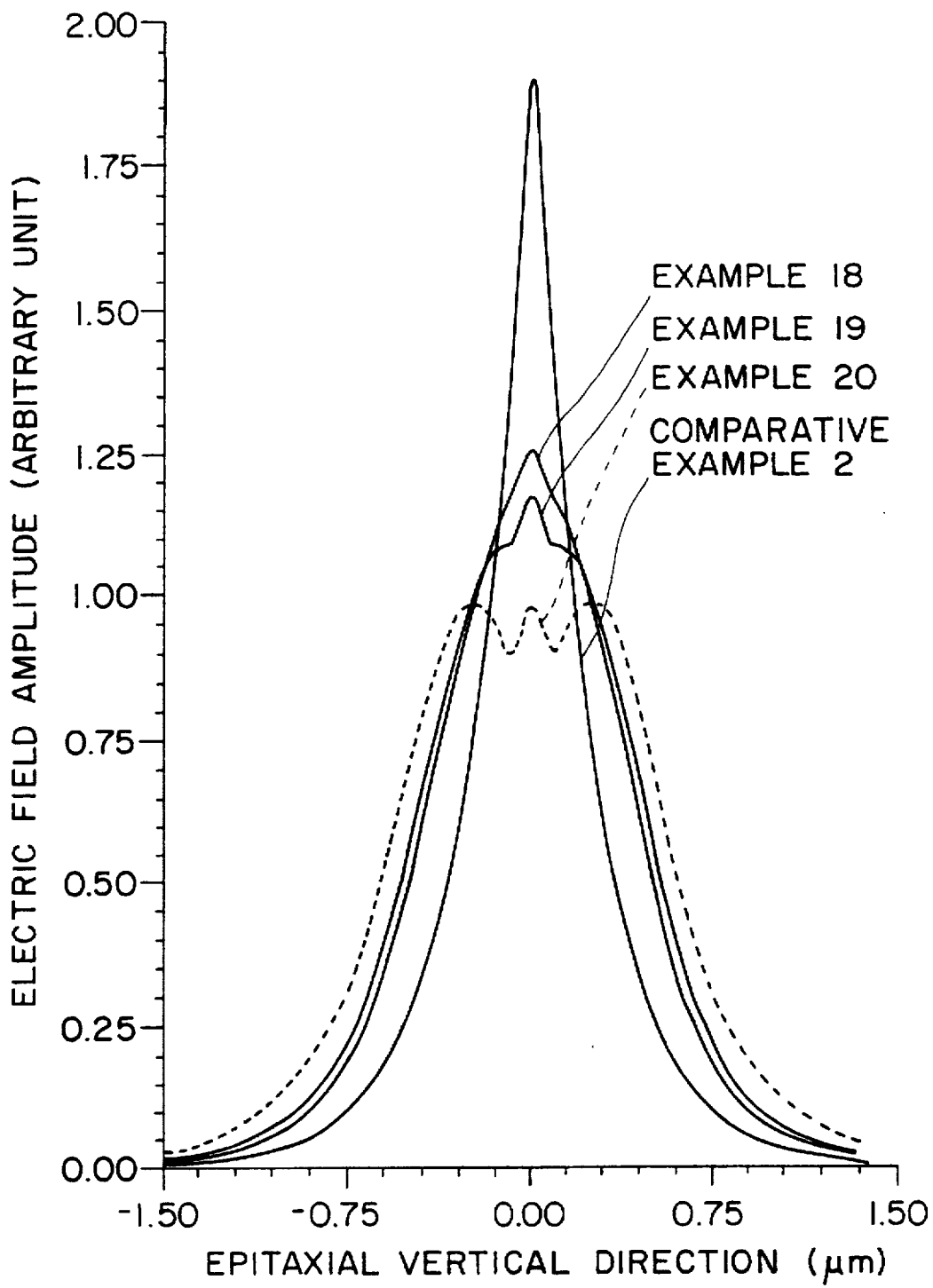
FIG. 9 shows near field patterns of examples 18–20 and comparative example 2 of the invention.
Figure 10:
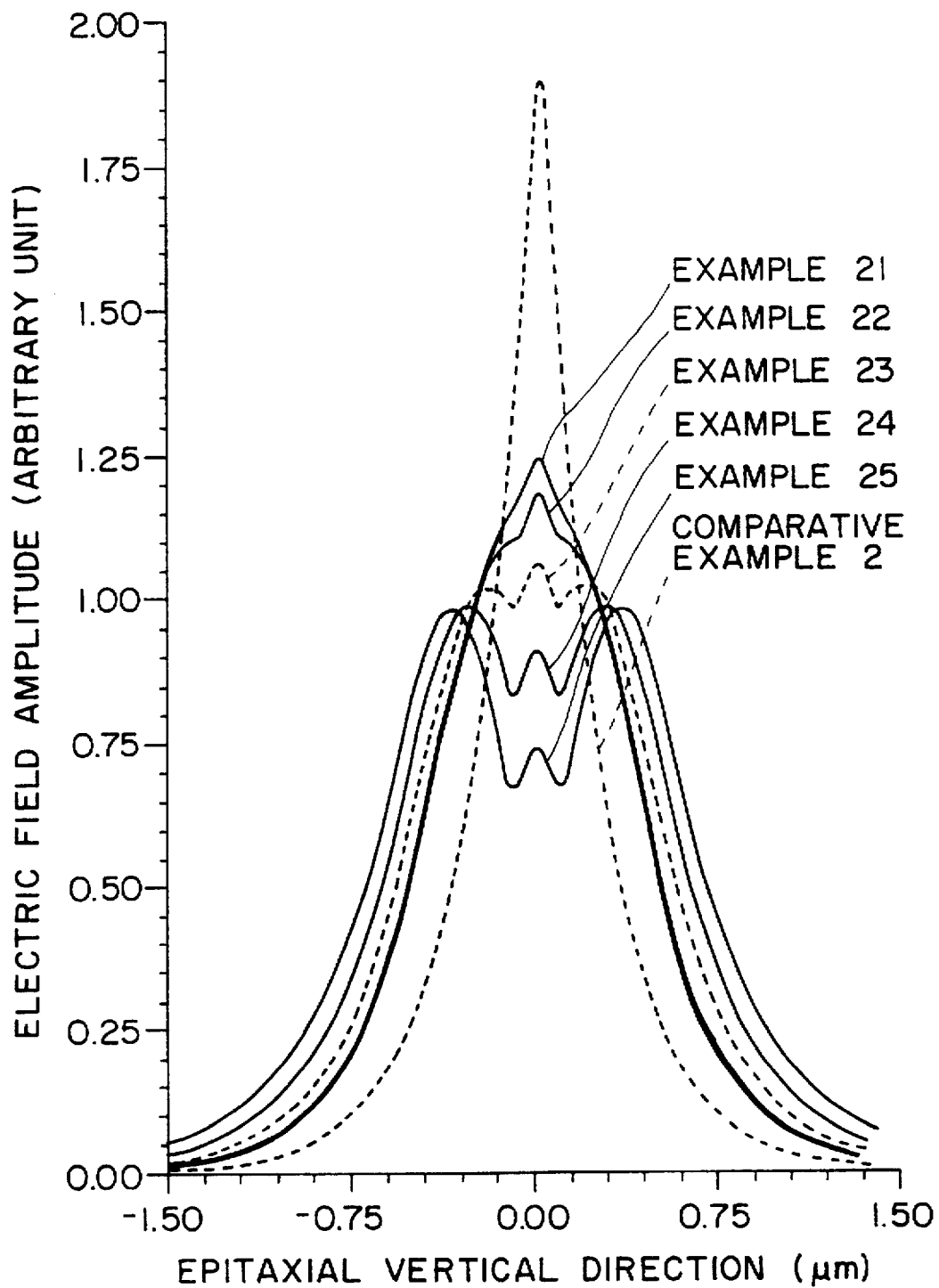
FIG. 10 shows near field patterns of examples 21–25 and comparative example 2 of the invention.
Figure 11:
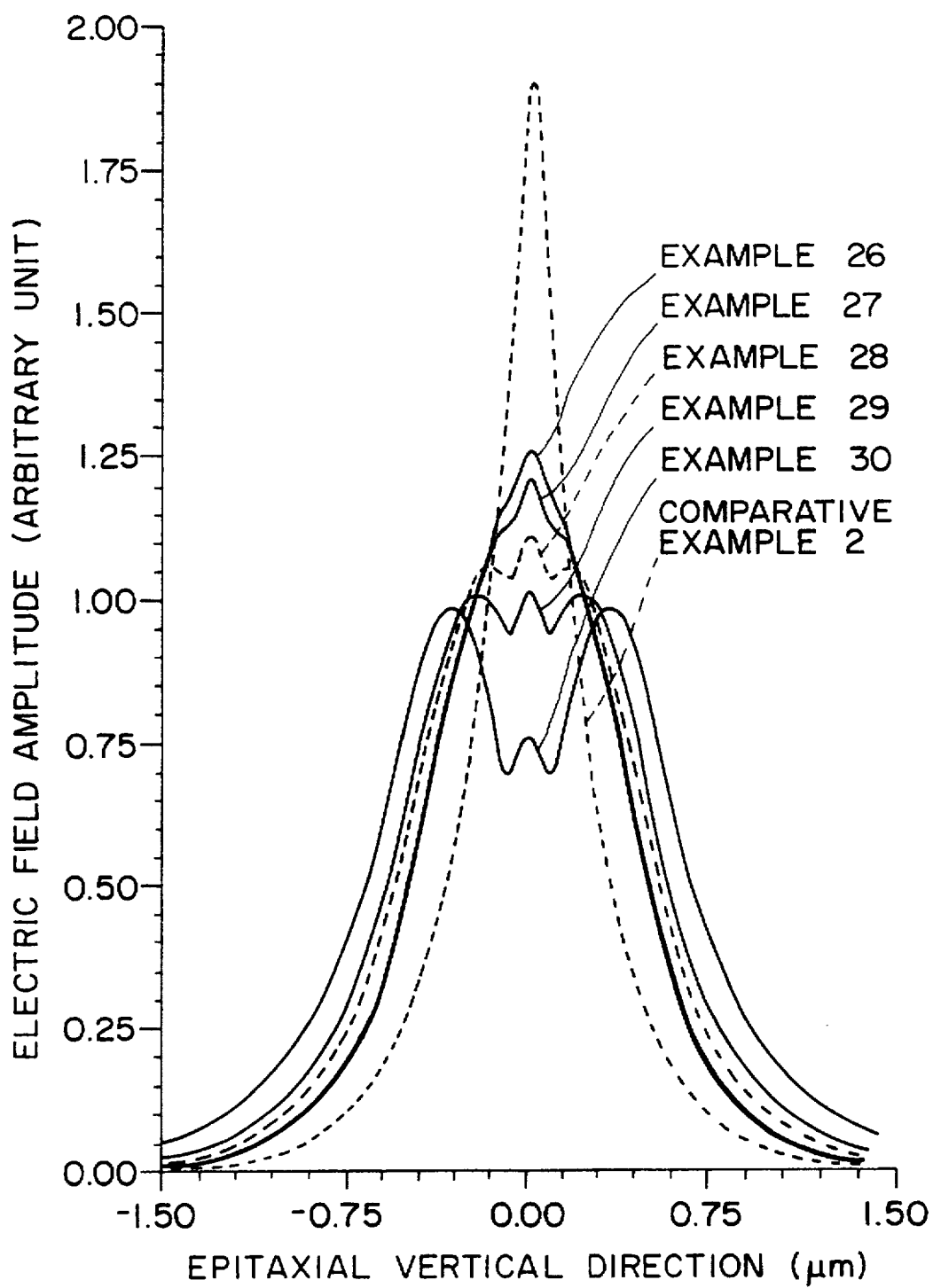
FIG. 11 shows near field patterns of examples 26–30 and comparative example 2 of the invention.
Figure 12:
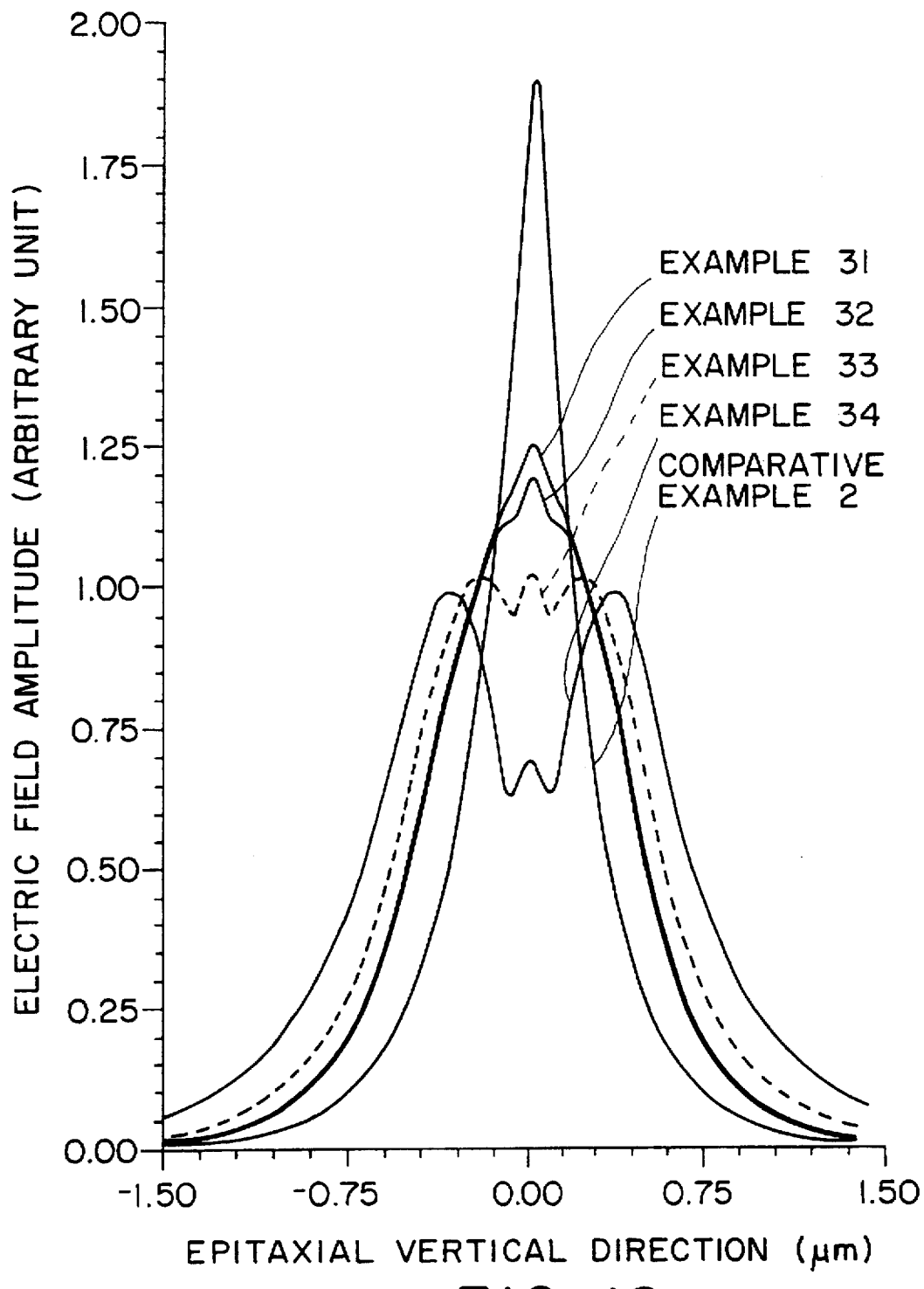
FIG. 12 shows near field patterns of examples 31–34 and comparative example 2 of the invention.
Figure 13:
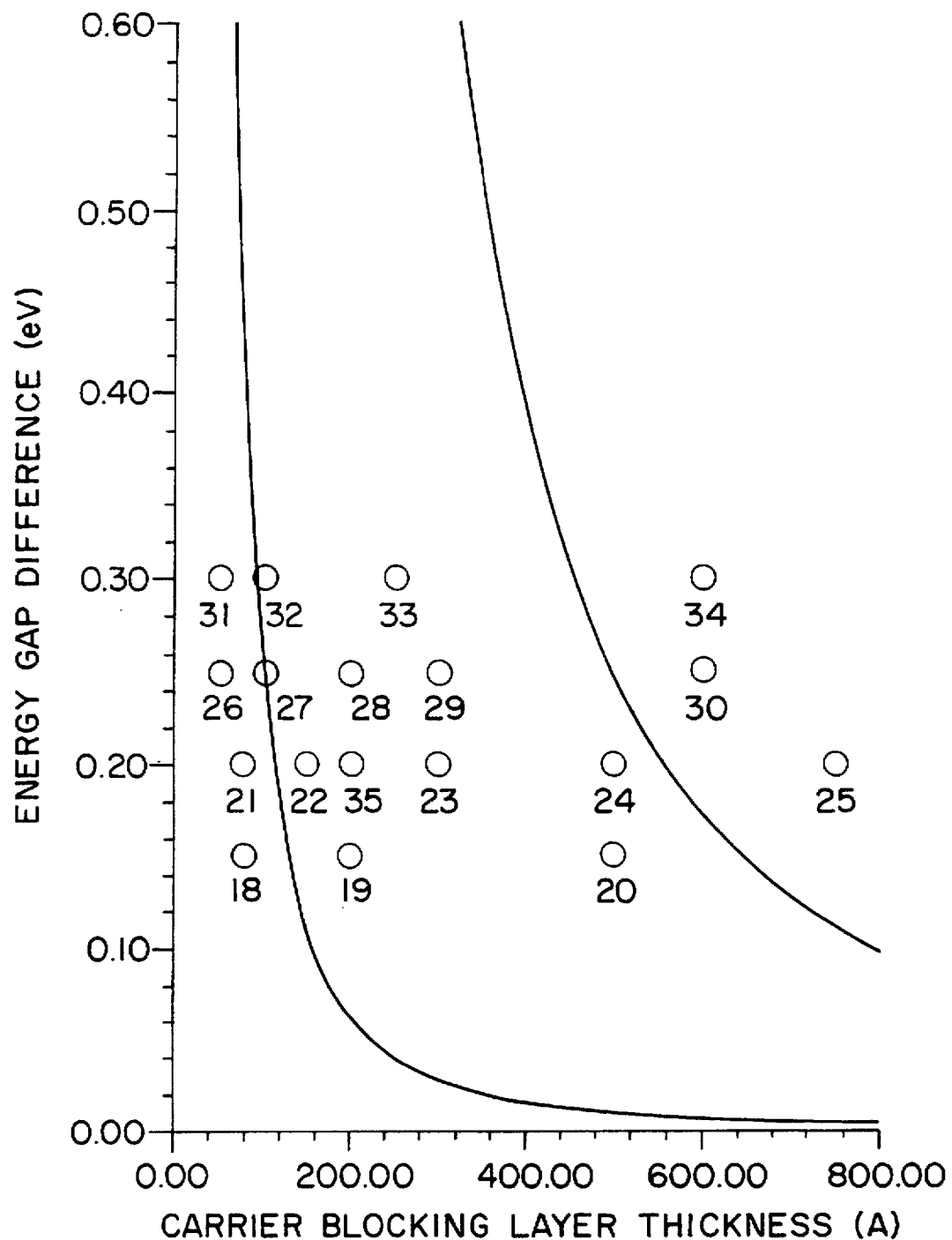
FIG. 13 shows diagram expressing the effective range of the carrier blocking layer, with the width of the carrier blocking layer plotted on the axis of abscissa and the energy gap difference on the axis of ordinate.
Figure 14:
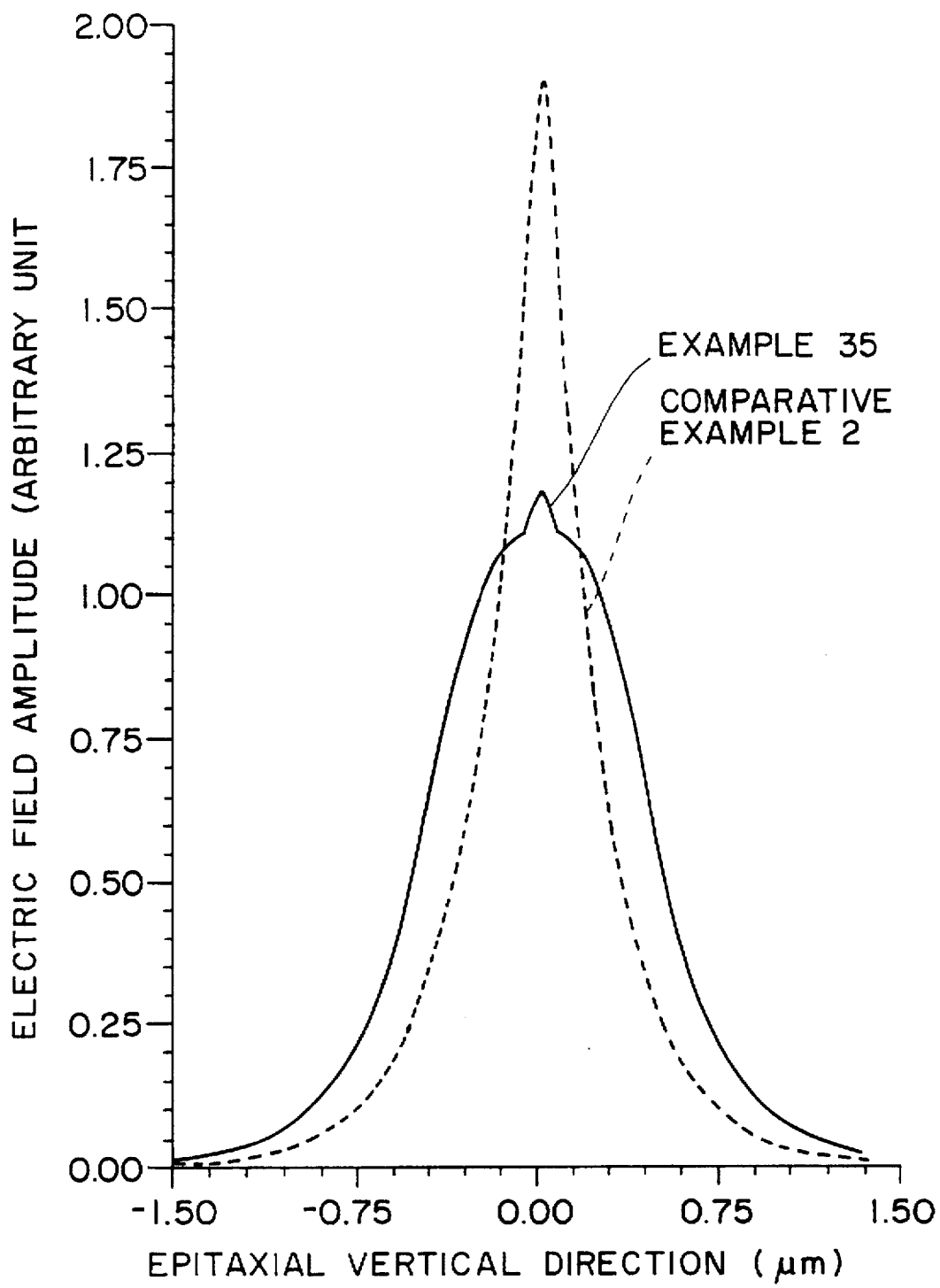
FIG. 14 shows near field patterns of example 35 and comparative example 2 of the invention.

FIG. 2 shows an epitaxial growth profile of examples 1–52 and comparative example 4. FIG. 3 shows an epitaxial growth profile of comparative examples 1–3. FIG. 4 shows near field patterns of examples 1–3 and comparative example 1; FIG. 5 shows near field patterns of examples 4 to 8 and comparative example 1; FIG. 6 shows near field patterns of examples 9–13 and comparative example 1; FIG. 7 shows near field patterns of example 14–17 and comparative example 1. FIG. 9 shows near field patterns of examples 18 to 20 and comparative example 2, FIG. 10 shows near field patterns of examples 21–25 and comparative example 2; FIG. 11 shows near field patterns of example 26–30 and comparative example 2, FIG. 12 shows near field patterns of examples 31 to 34 and comparative example 2; and FIG. 14 shows near field patterns of example 35 and comparative example 2. FIG. 8 expresses the effective range of carrier blocking layer, with the width of the carrier blocking layer plotted on the axis of abscissa, and the aluminum composition difference between the carrier blocking layer and the waveguide layer (the aluminum composition of carrier blocking layer minus the aluminum composition of waveguide layer) on the axis of ordinate in case the carrier blocking layer and the waveguide layer are formed of mixed crystal semiconductor of GaAs and AlAs. FIG. 13 expresses the effective range of carrier blocking layer, with the width of the carrier blocking layer plotted on the axis of abscissa, and the energy gap difference between the carrier blocking layer and the waveguide layer on the axis of ordinate. In FIGS. 8 and 13, circles indicate examples, and numerals refer to example numbers.

In the range above the upper right curve in FIG. 8 and FIG. 13, the anti-waveguiding function of the carrier blocking layer is too strong, and it has a bad effect on the waveguide mode. More specifically, a dent is formed in the waveguide mode near the active layer, and the light confinement rate is lowered, while the oscillation threshold current increases. At the same time, the waveguide mode is largely deviated from the Gaussian profile, and an aberration occurs on the radiation pattern. Accordingly, $V_1 < V_2/10$ is desired. In the range below the lower left curve, confinement of carriers is insufficient, and the temperature characteristic of the threshold current is worsened. An effective range is between two solid curves. Specifically, the condition $$2.5 \times 10^3/d_2^2 < Egs - Egd < 6.2 \times 10^4/d_2^2$$

is established.
And in the range where $$V_0/3 < V_1 < V_0$$

is satisfied, the waveguiding function of the active layer is optimally corrected by the carrier blocking layer, and the most preferable waveguide mode is achieved. As clear from FIGS. 4 to 12 and FIG. 14, the weak waveguide semiconductor lasers of comparative examples 1 and 2 show characteristic profiles pointed at the center, having exponential tails on both sides, whereas examples 1 to 35 show profiles close to the bell-shaped Gaussian beam. Accordingly, when using the semiconductor lasers of the examples, even in the same mode expanse as in the prior art, the beam intensity is low in the active layer 4 (mode center) where optical damage may occur, and as a result, as shown in Tables 14 and 15, together with the decrease of Al composition, the optical damage power level could be extremely raised.

That is, in examples 18 to 35, as compared with comparative examples 1, 2, decrease of radiation angle and a notable improvement of optical damage level are recognized. In Tables 4–13, the oscillation wavelength of laser is about 810 nm to 690 nm. The optical damage level is an optical output per facet.

Figure 15:
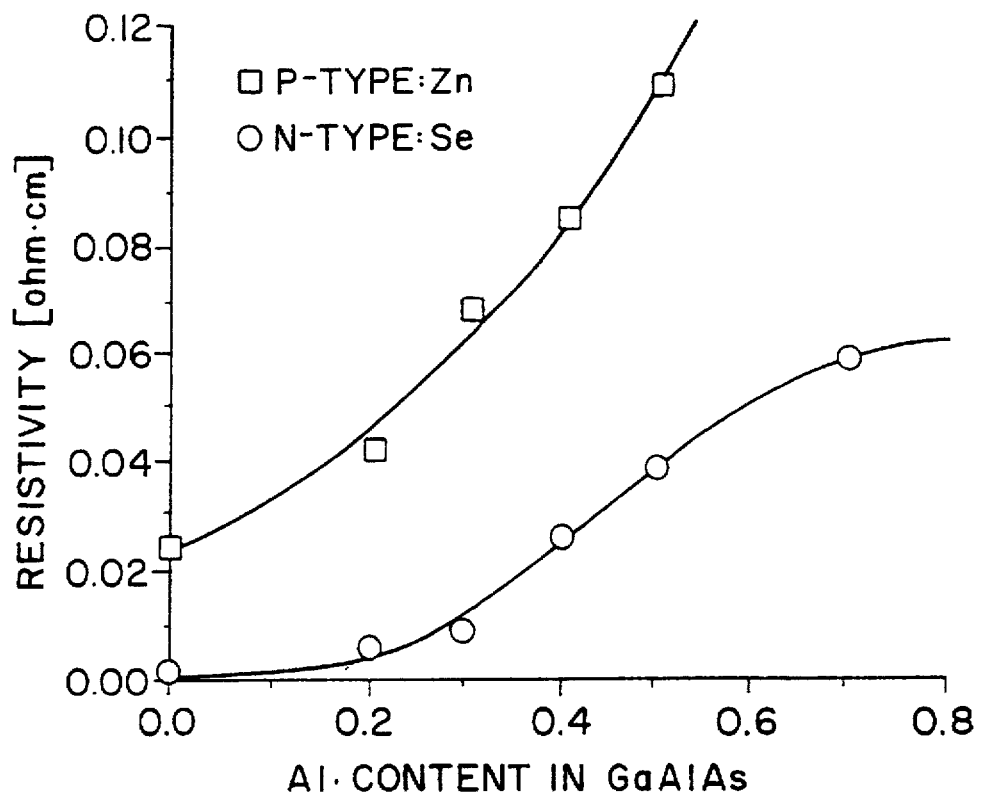
FIG. 15 shows graphs of the electric resistivity of $Al_xGa_{1-x}As$ semiconductor.
Figure 16:
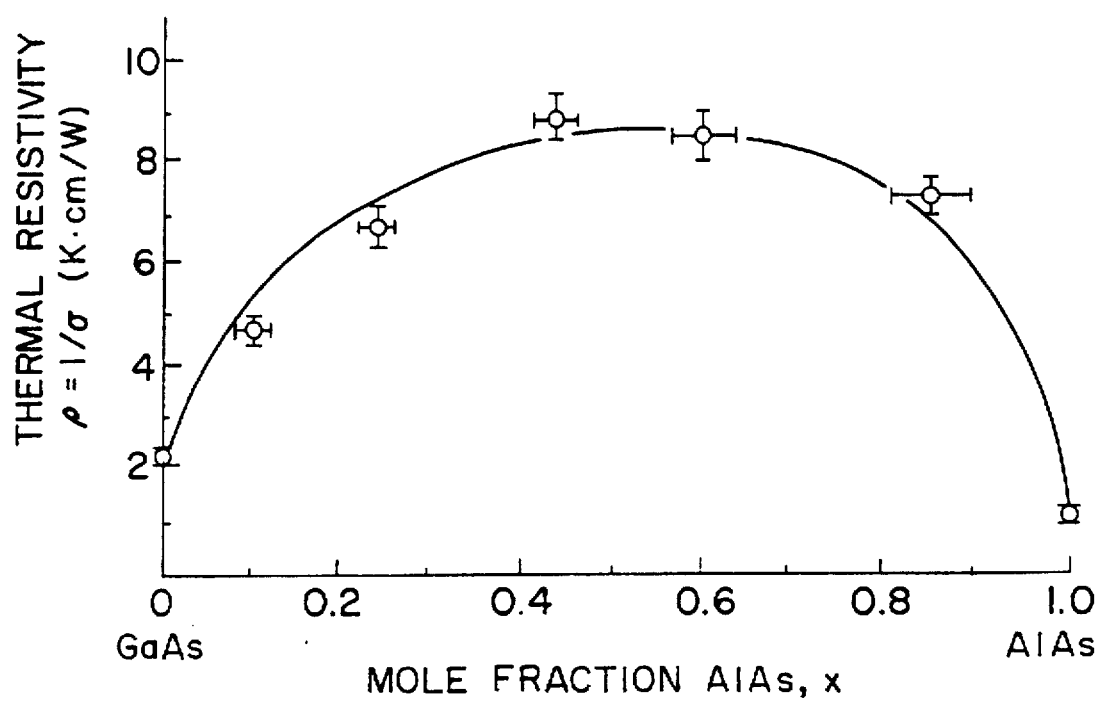
FIG. 16 shows a graph of the thermal resistivity of $Al_xGa_{1-x}As$ semiconductor.

In examples 1–17, the composition of the quantum well layer is $Ga_yIn_{1-y}As$ (y=0.8) and the oscillation wavelength are about 980 nm, but the value of y is not limited to this, and even in a range of 0.6<y<1.0, the same effects of the invention as described above are obtained by changing the width of the quantum well layer and the composition of the waveguide layer and cladding layer. In this case, the composition of the waveguide layer and cladding layer is sufficient at x=0.2 at maximum in the case of a mixed crystal semiconductor ($Al_xGa_{1-x}As$) of GaAs and AlAs, and as judged from FIGS. 15, 16, the electric resistance and thermal resistance can be lowered substantially.

As the technology common to the examples, Se was doped at $1 \times 10^{18}/cm_3$ in density as n-type dopant, and Zn was doped at the same density as p-type dopant. Stripe was formed by Zn diffusion from the surface through a $SiO_2$ mask, trial diode chips with gain guided structure were fabricated by cleaving, and the oscillation characteristic was measured in pulse mode after die bonding on LD mount. The characteristics of chip having a stripe width of 2.5 μm and a cavity length of 300 μm are shown in Tables 14 and 15, where optical coating is not applied on both facet.

In the examples 18–35 with $(Al_yGa_{1-y})_zIn_{1-z}P$ carrier block layer ($0 \leq y < 0.3$ and $0.20 \leq z \leq 0.83$), the composition of quantum well layer is $Al_xGa_{1-x}As$ ($0 \leq x \leq 0.2$), but this is not limited. The active layer may be the strained quantum well of $Ga_zIn_{1-z}As$ ($0.6 < z < 1.0$).

TABLE 14

| LD type | Normalized frequency V2 | Radiation angle (vertical epitaxial direction) | Optical damage level (mW) |
|---|---|---|---|
| Example 1 | 1.1 π | 26° | 120 |
| Example 2 | 1.1 π | 26° | 120 |
| Example 3 | 1.1 π | 25° | 120 |
| Example 4 | 1.1 π | 26° | 120 |
| Example 5 | 1.1 π | 26° | 120 |
| Example 6 | 1.1 π | 25° | 130 |
| Example 7 | 1.1 π | 24° | 130 |
| Example 8 | 1.1 π | 22° | 150 |
| Example 9 | 1.1 π | 26° | 120 |
| Example 10 | 1.1 π | 26° | 120 |
| Example 11 | 1.1 π | 25° | 130 |
| Example 12 | 1.1 π | 24° | 130 |
| Example 13 | 1.1 π | 22° | 160 |
| Example 14 | 1.1 π | 26° | 120 |
| Example 15 | 1.1 π | 25° | 130 |
| Example 16 | 1.1 π | 24° | 140 |
| Example 17 | 1.1 π | 21° | 180 |
| Comparative Example 1 | 0.09 π | 33° | 80 |

TABLE 15

| LD type | Normalized frequency | Radiation angle (vertical epitaxial direction) | Optical damage level (mW) |
|---|---|---|---|
| Example 18 | 1.1 π | 29° | 150 |
| Example 19 | 1.1 π | 27° | 160 |
| Example 20 | 1.1 π | 24° | 180 |
| Example 21 | 1.1 π | 29° | 150 |
| Example 22 | 1.1 π | 28° | 160 |
| Example 23 | 1.1 π | 25° | 170 |
| Example 24 | 1.1 π | 23° | 170 |
| Example 25 | 1.1 π | 21° | 170 |
| Example 26 | 1.1 π | 29° | 150 |
| Example 27 | 1.1 π | 28° | 160 |
| Example 28 | 1.1 π | 26° | 170 |
| Example 29 | 1.1 π | 25° | 180 |
| Example 30 | 1.1 π | 21° | 180 |
| Example 31 | 1.1 π | 29° | 130 |
| Example 32 | 1.1 π | 28° | 150 |
| Example 33 | 1.1 π | 25° | 180 |
| Example 34 | 1.1 π | 21° | 180 |
| Example 35 | 1.1 π | 28° | 100 |
| Comparative Example 2 | 0.1 π | 35° | 90 |

In the following are described embodiments 36–52 in which the Al contents of the waveguide layer, barrier layer, and side barrier layer in the embodiments 1–17 are changed to 0.

By the following reasons, the Al content of these layers are changed to 0:

1) a burying process which will be necessary for more sophisticated structure, like index guide structure, DFB (distributed-feed back, and so on) is facilitated, because the regrowing interface is made to be Al-free.

2) the thermal and electrical resistances are optimum in the Al content x of 0.

In examples 36 to 52, the structures thereof are the same as that in FIG. 2 and the specific constitution of each layer is as follows.

3) from the practical crystal growth standpoint to obtain better crystal quality.

n-type cap layer 11 Thickness: 0.3 μm Composition: GaAs p-type cladding layer 7 Thickness: 1.0 μm Composition: $Al_{0.01}Ga_{0.90}As$ p-type waveguide layer 6 Thickness: 0.80 μm Composition: GaAs n-type waveguide layer 2 Thickness: 0.80 μm Composition: GaAs n-type cladding layer 1 Thickness: 1.0 μm Composition: $Al_{0.10}Ga_{0.90}As$ n-type buffer layer 10 Thickness: 0.5 μm Composition: GaAs n-type substrate 8 Composition: (100)GaAs In the comparative example 3, the structure thereof is the same as that in FIG. 3 and the specific constitution of each layer is as follows.

n-type cap layer 11 Thickness: 0.3 μm Composition: GaAs p-type cladding layer 7 Thickness: 1.5 μm Composition: $Al_{0.17}Ga_{0.83}As$ n-type cladding layer 1 Thickness: 1.5 μm Composition: $Al_{0.17}Ga_{0.83}As$ n-type buffer layer 10 Thickness: 0.5 μm Composition: GaAs n-type substrate 8 Composition: (100)GaAs.pa Besides, the embodiment of comparative example 3 does not have enough temperature stability for the continuous operation.

TABLE 16

| Layer | Example 36 | Example 37 | Example 38 |
|---|---|---|---|
| P-type carrier blocking layer 5 (yes/no) | yes | yes | yes |
| Thickness (angstroms) | 80 | 200 | 500 |
| Composition: $Al_xGa_{1-x}As$ | x = 0.05 | x = 0.05 | x = 0.05 |
| Side barrier layer 12 | yes | yes | yes |
| Thickness (angstroms) | 500 | 500 | 500 |
| Composition: $Al_xGa_{1-x}As$ | x = 0 | x = 0 | x = 0 |
| Quantum well layer 13 | yes | yes | yes |
| Quantity of layer | 4 | 4 | 4 |
| Thickness (angstroms) | 80 | 80 | 80 |
| Composition: $Ga_yIn_{1-y}As$ | y = 0.8 | y = 0.8 | y = 0.8 |
| Barrier layer 14 | yes | yes | yes |
| Thickness (angstroms) | 50 | 50 | 50 |
| Composition: $Ga_xIn_{1-x}As$ | x = 0 | x = 0 | x = 0 |
| N-type carrier blocking layer 3 (yes/no) | yes | yes | yes |
| Thickness (angstroms) | 80 | 200 | 500 |
| Composition: $Al_xGa_{1-x}As$ | x = 0.05 | x = 0.05 | x = 0.05 |

TABLE 17

| Layer | Example 39 | Example 40 | Example 41 |
|---|---|---|---|
| P-type carrier blocking layer 5 (yes/no) | yes | yes | yes |
| Thickness (angstroms) | 80 | 150 | 300 |
| Composition: $Al_xGa_{1-x}As$ | x = 0.15 | x = 0.15 | x = 0.15 |
| Side barrier layer 12 | yes | yes | yes |
| Thickness (angstroms) | 500 | 500 | 500 |
| Composition: $Al_xGa_{1-x}As$ | x = 0 | x = 0 | x = 0 |
| Quantum well layer 13 | yes | yes | yes |
| Quantity of layer | 4 | 4 | 4 |
| Thickness (angstroms) | 80 | 80 | 80 |
| Composition: $Ga_yIn_{1-y}As$ | y = 0.8 | y = 0.8 | y = 0.8 |

TABLE 17-continued

| Layer | Example 39 | Example 40 | Example 41 |
|---|---|---|---|
| Barrier layer 14 | yes | yes | yes |
| Thickness (angstroms) | 50 | 50 | 50 |
| Composition: $Al_xGa_{1-x}As$ | x = 0 | x = 0 | x = 0 |
| N-type carrier blocking layer 3 (yes/no) | yes | yes | yes |
| Thickness (angstroms) | 80 | 150 | 300 |
| Composition: $Al_xGa_{1-x}As$ | x = 0.15 | x = 0.15 | x = 0.15 |

TABLE 18

| Layer | Example 42 | Example 43 | Example 44 |
|---|---|---|---|
| P-type carrier blocking layer 5 (yes/no) | yes | yes | yes |
| Thickness (angstroms) | 500 | 750 | 50 |
| Composition: $Al_xGa_{1-x}As$ | x = 0.15 | x = 0.15 | x = 0.25 |
| Side barrier layer 12 | yes | yes | yes |
| Thickness (angstroms) | 500 | 500 | 500 |
| Composition: $Al_xGa_{1-x}As$ | x = 0 | x = 0 | x = 0 |
| Quantum well layer 13 | yes | yes | yes |
| Quantity of layer | 4 | 4 | 4 |
| Thickness (angstroms) | 80 | 80 | 80 |
| Composition: $Ga_yIn_{1-y}As$ | y = 0.8 | y = 0.8 | y = 0.8 |
| Barrier layer 14 | yes | yes | yes |
| Thickness (angstroms) | 50 | 50 | 50 |
| Composition: $Al_xGa_{1-x}As$ | x = 0 | x = 0 | x = 0 |
| N-type carrier blocking layer 3 (yes/no) | yes | yes | yes |
| Thickness (angstroms) | 500 | 750 | 50 |
| Composition: $Al_xGa_{1-x}As$ | x = 0.15 | x = 0.15 | x = 0.25 |

TABLE 19

| Layer | Example 45 | Example 46 | Example 47 |
|---|---|---|---|
| P-type carrier blocking layer 5 (yes/no) | yes | yes | yes |
| Thickness (angstroms) | 100 | 200 | 300 |
| Composition: $Al_xGa_{1-x}As$ | x = 0.25 | x = 0.25 | x = 0.25 |
| Side barrier layer 12 | yes | yes | yes |
| Thickness (angstroms) | 500 | 500 | 500 |
| Composition: $Al_xGa_{1-x}As$ | x = 0 | x = 0 | x = 0 |
| Quantum well layer 13 | yes | yes | yes |
| Quantity of layer | 4 | 4 | 4 |
| Thickness (angstroms) | 80 | 80 | 80 |
| Composition: $Ga_yIn_{1-y}As$ | y = 0.8 | y = 0.8 | y = 0.8 |
| Barrier layer 14 | yes | yes | yes |
| Thickness (angstroms) | 50 | 50 | 50 |
| Composition: $Al_xGa_{1-x}As$ | x = 0 | x = 0 | x = 0 |
| N-type carrier blocking layer 3 (yes/no) | yes | yes | yes |
| Thickness (angstroms) | 100 | 200 | 300 |
| Composition: $Al_xGa_{1-x}As$ | x = 0.25 | x = 0.25 | x = 0.25 |

TABLE 20

| Layer | Example 48 | Example 49 | Example 50 |
|---|---|---|---|
| P-type carrier blocking layer 5 (yes/no) | yes | yes | yes |
| Thickness (angstroms) | 600 | 50 | 100 |
| Composition: $Al_xGa_{1-x}As$ | x = 0.25 | x = 0.35 | x = 0.35 |
| Side barrier layer 12 | yes | yes | yes |
| Thickness (angstroms) | 500 | 500 | 500 |
| Composition: $Al_xGa_{1-x}As$ | x = 0 | x = 0 | x = 0 |
| Quantum well layer 13 | yes | yes | yes |
| Quantity of layer | 4 | 4 | 4 |
| Thickness (angstroms) | 80 | 80 | 80 |
| Composition: $Ga_yIn_{1-y}As$ | y = 0.8 | y = 0.8 | y = 0.8 |
| Barrier layer 14 | yes | yes | yes |

TABLE 20-continued

| Layer | Example 48 | Example 49 | Example 50 |
|---|---|---|---|
| Thickness (angstroms) | 50 | 50 | 50 |
| Composition: $Al_xGa_{1-x}As$ | x = 0 | x = 0 | x = 0 |
| N-type carrier blocking layer 3 (yes/no) | yes | yes | yes |
| Thickness (angstroms) | 600 | 50 | 100 |
| Composition: $Al_xGa_{1-x}As$ | x = 0.25 | x = 0.35 | x = 0.35 |

TABLE 21

| Layer | Example 51 | Example 52 | Comparative Example 3 |
|---|---|---|---|
| P-type carrier blocking layer 5 (yes/no) | yes | yes | no |
| Thickness (angstroms) | 250 | 600 | — |
| Composition: $Al_xGa_{1-x}As$ | x = 0.35 | x = 0.35 | — |
| Side barrier layer 12 | yes | yes | yes |
| Thickness (angstroms) | 500 | 500 | 500 |
| Composition: $Al_xGa_{1-x}As$ | x = 0 | x = 0 | x = 0 |
| Quantum well layer 13 | yes | yes | yes |
| Quantity of layer | 4 | 4 | 4 |
| Thickness (angstroms) | 80 | 80 | 80 |
| Composition: $Ga_yIn_{1-y}As$ | y = 0.8 | y = 0.8 | y = 0.8 |
| Barrier layer 14 | yes | yes | yes |
| Thickness (angstroms) | 50 | 50 | 50 |
| Composition: $Al_xGa_{1-x}As$ | x = 0 | x = 0 | x = 0 |
| N-type carrier blocking layer 3 (yes/no) | yes | yes | no |
| Thickness (angstroms) | 250 | 600 | — |
| Composition: $Al_xGa_{1-x}As$ | x = 0.35 | x = 0.35 | — |

TABLE 22

| LD type | Normalized frequency V2 | Radiation angle (vertical epitaxial direction) | Optical damage level (mW) |
|---|---|---|---|
| Example 36 | 1.1 π | 26° | not measured |
| Example 37 | 1.1 π | 26° | not measured |
| Example 38 | 1.1 π | 25° | not measured |
| Example 39 | 1.1 π | 26° | not measured |
| Example 40 | 1.1 π | 26° | 180 |
| Example 41 | 1.1 π | 25° | 200 |
| Example 42 | 1.1 π | 24° | 200 |
| Example 43 | 1.1 π | 22° | 230 |
| Example 44 | 1.1 π | 26° | 180 |
| Example 45 | 1.1 π | 26° | 180 |
| Example 46 | 1.1 π | 25° | 200 |
| Example 47 | 1.1 π | 24° | 200 |
| Example 48 | 1.1 π | 22° | 220 |
| Example 49 | 1.1 π | 26° | 180 |
| Example 50 | 1.1 π | 25° | 200 |
| Example 51 | 1.1 π | 24° | 210 |
| Example 52 | 1.1 π | 21° | 270 |
| Comparative Example 3 | 0.09 π | 33° | 120 |
| Comparative Example 4 | 1.1 π | 25° | 180 |

Examples 36 to 52 correspond to examples 1 to 17, respectively, and comparative example 3 corresponds to comparative example 1. The deviation of radiation angle between the corresponding ones is less than 1%, and the waveguide mode profiles can be regarded as same. The positioning in FIG. 8 is also same with each corresponding one. The improvement of COD level can be seen in the Tables 14 and 22.

Figure 17:
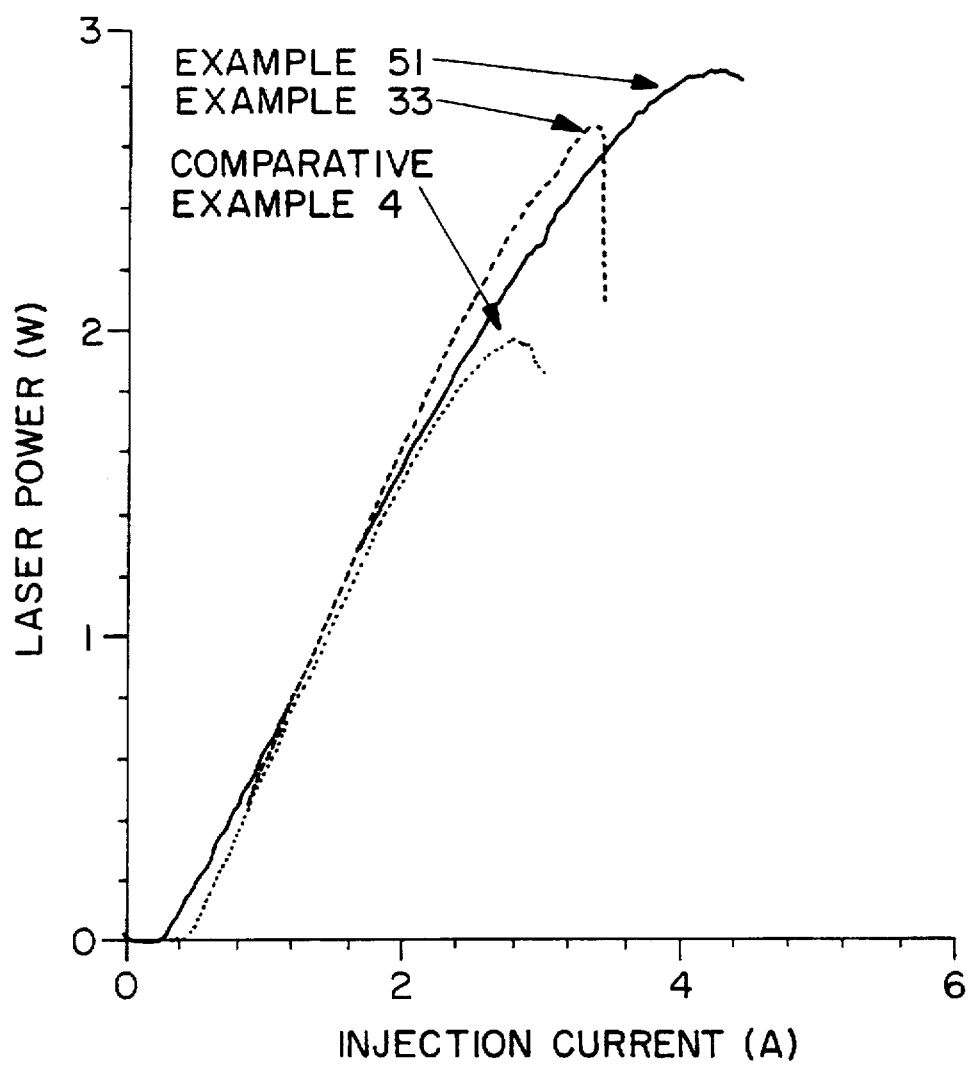
FIG. 17 shows the characteristics of the laser power versus injection current of the typical embodiments (example 33 and 51, and comparative example 4) with the optimized device parameters; the stripe width of 50 µm, the cavity length of 900 µm, and the optical coatings with refrectivities of 4% and 96% are applied on the front and rear facets.

FIG. 17 shows the characteristics of the laser power versus injection current of the typical embodiments (example 33 and 51, and comparative example 4) with the device parameters optimized for continuous oscillation mode. For these devices, the stripwidths are 50 μm, the cavity lengths are 900 μm, and the optical coatings with the reflectivities of 4% and 96% were applied on the front and rear facets.

Comparative example 4 has the same epitaxy structure with example 33, but the $(Al_{0.12}Ga_{0.88})_{0.51}In_{0.49}P$ carrier block layers are replaced by $Al_{0.5}Ga_{0.5}As$ carrier block layers with the same thickness.

The output power levels of the these embodiments are higher than the values reported for the conventional broad-area laser diode with the same stripe width. Also, example 33 (shown in Table 12) and example 51 (shown in Table 21) were proved to be superior to the comparative example 4 with the composition of the AlGaAs to in the carrier block layer and of the GaAs in the quantum well layer (shown in Table 13).

In particularly, the maximum laser power is about 2 W for comparative Example 4 as compared to about 2.6 W for Example 33 and about 2.8 W for Example 51.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A semiconductor laser device comprising:

an active layer, carrier blocking layers for reducing the waveguide function of the active layer, disposed on both sides of the active layer, waveguide layers disposed on both outer sides of the carrier blocking layers, and cladding layers disposed on both outer sides of the waveguide layers, wherein the active layer comprises a lamination of side barrier layers and a quantum well layer sandwiched therebetween, or a lamination of outermost side barrier layers, and at least two quantum well layers and a barrier layer sandwiched between adjacent quantum well layers and wherein the composition of the quantum well layer is $Ga_yIn_{1-y}As$ (0.6<y<1.0), and the carrier blocking layers are made of a material whose band gap is larger and whose refractive index is lower than the material of the waveguide layers, and further wherein the composition of the waveguide layers is $Al_{x1}Ga_{1-x1}As$ and the composition of the cladding layers is $Al_{x2}Ga_{1-x2}As$, wherein, $0 \leq x1 < x2 < 0.20$.

2. The semiconductor laser device of claim 1, wherein the refractive index of the waveguide layers increases gradually in the direction from the cladding layers side toward the carrier blocking layers side.

3. A semiconductor laser device comprising:

an active layer, carrier blocking layers for reducing the waveguide function of the active layer, disposed on both sides of the active layer, waveguide layers disposed on both outer sides of the carrier blocking layers, and cladding layers disposed on both outer sides of the waveguide layers, wherein the active layer comprises a lamination of side barrier layers and a quantum well layer sandwiched therebetween, or a lamination of outermost side barrier layers, and at least two quantum well layers and a barrier layer sandwiched between adjacent quantum well layers and wherein the composition of the quantum well layer is $Ga_yIn_{1-y}As$ (0.6<y<1.0), and the carrier blocking layers are made of a material whose band gap is larger and whose refractive index is lower than the material of the waveguide layers, and further wherein the index (normalized frequency) $V_2$ for expressing the waveguide function of the waveguide layer is defined as $$V_2 = \pi \cdot d_3/\lambda \cdot (N_0{}^2 - N_3{}^2)^{0.5}$$

wherein $\pi$ is the ratio of the circumference of a circle to its diameter, $\lambda$ is the oscillation wavelength, $d_3$ is the thickness between both cladding layers, $N_0$ is the refractive index of the waveguide layer, and $N_3$ is the refractive index of the cladding layer, and the index $V_2$ is in the following range:
$\pi/3 < V_2 < 2\pi$.

4. A semiconductor laser device comprising an active layer, carrier blocking layers provided on both outer sides of the section of said active layer formed in the vertical direction from the device surface, wherein the active layer comprises a lamination of side barrier layers and a quantum well layer sandwiched therebetween, or a lamination of outermost side barrier layers, and at least two quantum well layers and a barrier layer sandwiched between adjacent quantum well layers, waveguide layers and are provided on both outer sides of the carrier blocking layers and, cladding layers provided on both outer sides of the waveguide layers, and wherein the composition of each quantum well layer is $Al_xGa_{1-x}As$ (0≦x≦0.2) or $Ga_zIn_{1-z}As$ (0.6<z<1.0), the composition of the carrier blocking layers is $(Al_yGa_{1-y})_zIn_{1-z}P$ (0≦y<0.3, 0.20≦z'≦0.83), and the waveguide layers and cladding layers are composed of GaAs, or mixed crystal semiconductor of AlAs and GaAs.

5. The semiconductor laser device of claim 4, wherein the refractive index of the waveguide layers increases gradually in the direction from the cladding layers side toward the carrier blocking layers side.

6. A semiconductor laser device comprising:

an active layer, carrier blocking layers provided on both outer sides of the section of said active layer formed in the vertical direction from the device surface, wherein the active layer comprises a lamination of side barrier layers and a quantum well layer sandwiched therebetween, or a lamination of outermost side barrier layers, and at least two quantum well layers and a barrier layer sandwiched between adjacent quantum well layers, waveguide layers provided on both outer sides of the carrier blocking layers, and cladding layers provided on both outer sides of the waveguide layers, and wherein the composition of each quantum well layer is $Al_xGa_{1-x}As$ (0<x<0.2) or $Ga_zIn_{1-z}As$ (0.6<z<1.0), the composition of the carrier blocking layer is $(Al_yGa_{1-y})_zIn_{1-z}P$ (0<y<0.3, 0.20<z'<0.83), and the waveguide layers and cladding layers are composed of GaAs, or mixed crystal semiconductor of AlAs and GaAs, wherein the index (normalized frequency) $V_0$ for expressing the waveguide function of the active layer is defined as $$V_0 = \pi \cdot d_1/\lambda \cdot (N_1{}^2 - N_0{}^2)^{0.5}$$

where $\pi$ is the ratio of the circumference of a circle to its diameter, $\lambda$ is the oscillation wavelength, $d_1$ is the thickness of the quantum well layer, $N_0$ is the refractive index of the waveguide layer; employing the maximum value when a refractive index distribution exists in the waveguide layer, and $N_1$ is the refractive index of the quantum well layer; in the case of a multi-quantum well with m quantum well layers, $V_0$ is multiplied by m, the index $V_1$ (normalized frequency) expressing the anti-waveguide function of the carrier blocking layers is defined as $$V_1 = \pi \cdot d_2/\lambda \cdot (N_0{}^2 - N_2{}^2)^{0.5}$$

where $d_2$ is the thickness of the carrier blocking layers, and $N_2$ is the refractive index of the carrier blocking layers, the index $V_2$ (normalized frequency) expressing the waveguide function of the waveguide layers is defined as $$V_2 = \pi \cdot d_3/\lambda \cdot (N_0{}^2 - N_3{}^2)^{0.5}$$

where $d_3$ is the thickness between both cladding layers, and $N_3$ is the refractive index of the cladding layers, and $V_1$ and $V_2$ are in the following range:
$V_1 < V_2/10$.

7. A semiconductor laser device comprising:

an active layer, carrier blocking layers provided on both outer sides of the section of said active layer formed in the vertical direction from the device surface, wherein the active layer comprises a lamination of side barrier layers and a quantum well, layer sandwiched therebetween, or a lamination of outermost side barrier layers, and at least two quantum well layers and a barrier layer sandwiched between adjacent quantum well layers, waveguide layers provided on both outer sides of the carrier blocking layers, and cladding layers provided on both outer sides of the waveguide layers, and wherein the composition of each quantum well layer is $Al_xGa_{1-x}As$ (0<x<0.2) or $Ga_zIn_{1-z}As$ (0.6<z<1.0), the composition of the carrier blocking layer is $(Al_yGa_{1-y})_zIn_{1-z}P$ (0<y<0.3, 0.20<z'<0.83), and the waveguide layers and cladding layers are composed of GaAs, or mixed crystal semiconductor of AlAs and GaAs, wherein the index (normalized frequency) $V_2$ for expressing the waveguide function of the waveguide layer is defined as $$V_2 = \pi \cdot d_3/\lambda \cdot (N_0{}^2 - N_3{}^2)^{0.5}$$

(wherein $\pi$ is the ratio of the circumference of a circle to its diameter, $\lambda$ is the oscillation wavelength, $d_3$ is the thickness between both cladding layers, and $N_3$ is the refractive index of the cladding layers, and the index $V_2$ is in the following range:

$\pi/3 < V_2 < 2\pi$.

8. The semiconductor laser device of claim 6, wherein the relation of the energy gap $E_{gs}$ (eV) of the carrier blocking layers, the thickness $d_2$ (angstroms) of the carrier blocking layers, and the energy gap $E_{gd}$ of the waveguide layers (eV), (the minimum value is employed in case there is a distribution in the energy gap) is in the following range:

$E_{gs} - E_{gd} > 2.5 \times 10^3 / d_2^2$ $E_{gs} - E_{gd} < 6.2 \times 10^4 / d_2^2$.

9. The semiconductor laser device of claim 6, wherein $V_0$ and $V_1$ are in the following range:

$V_0/3 < V_1 < V_0$.

10. The semiconductor laser device of claim 1, wherein the index (normalized frequency) $V_0$ for expressing the waveguiding function of the active layer is defined as $V_0 = \pi \cdot d_1 / \lambda \cdot (N_1^2 - N_0^2)^{0.5}$ wherein $\pi$ is the ratio of the circumference of a circle to its diameter, $\lambda$ is the oscillation wavelength, $d_1$ is the thickness of the quantum well layer, $N_0$ is the refractive index of the waveguide layer, employing the maximum value when a refractive index distribution exists in the waveguide layer, and $N_1$ is the refractive index of the quantum well layer; and in the case of an active layer with a m quantum well layers, $V_0$ is multiplied by m.

the index $V_1$ (normalized frequency) expressing the anti-waveguiding function of the carrier blocking layers is defined as $V_1 = \pi \cdot d_2 / \lambda \cdot (N_0^2 - N_2^2)^{0.5}$ where $d_2$ is the thickness of the each carrier blocking layer, and $N_2$ is the refractive index of the carrier blocking layers, the index $V_2$ (normalized frequency) expressing the waveguiding function of the waveguide layers is defined as $V_2 = \pi \cdot d_3 / \lambda \cdot (N_0^2 - N_3^2)^{0.5}$ where $d_3$ is the thickness between both cladding layers, and $N_3$ is the refractive index of the cladding layers, and $V_1$ and $V_2$ are in the following range:

$V_1 < V_2/10$.

11. The semiconductor device of claim 1, wherein the index (normalized frequency) $V_2$ for expressing the waveguide function of the waveguide layer is defined as $V_2 = \pi \cdot d_3 / \lambda \cdot (N_0^2 - N_3^2)^{0.5}$ wherein $\pi$ is the ratio of the circumference of a circle to its diameter, $\lambda$ is the oscillation wavelength, $d_3$ is the thickness between both cladding layers, and $N_3$ is the refractive index of the cladding layer, and the index $V_2$ is in the following range:

$\pi/3 < V_2 < 2\pi$.

12. The semiconductor laser device of claim 10, wherein the composition of the carrier blocking layers is $Al_{z+dz}Ga_{1-z-dz}As$, the composition of the waveguide layers is $Al_zGa_{1-z-dz}As$ (where the minimum value is employed in case z is variable), and the thickness of the carrier blocking layers is $d_2$ (angstroms), and, in this condition, dz (atomic ratio) is in the following range:

$dz > 2.2 \times 10^3 / d_2^2$ $dz < 5.0 \times 10^4 / d_2^2$.

13. The semiconductor laser device of claim 11, wherein the composition of the carrier blocking layers is $Al_{x+dz}Ga_{1-z-dz}As$, the composition of the waveguide layers is $Al_zGa_{1-z}As$ (where the minimum value is employed in case z is variable), and the thickness of the carrier blocking layers is $d_2$ (angstroms), and, in this condition, dz (atomic ratio) is in the following range:

$dz > 2.2 \times 10^3 / d_2^2$ $dz < 5.0 \times 10^4 / d_2^2$.

14. The semiconductor laser device of claim 10, wherein $V_0$ AND $V_1$ are in the following range:

$V_0/3 < V_1 < V_0$.

15. The semiconductor laser device of claim 11, wherein $V_0$ and $V_{1a}$ are in the following range $V_0/3 < V_1 < V_0$.

* * * * *